United States Patent
Guo et al.

(10) Patent No.: US 10,097,051 B2
(45) Date of Patent: Oct. 9, 2018

(54) RECTENNA CIRCUIT ELEMENTS, CIRCUITS, AND TECHNIQUES FOR ENHANCED EFFICIENCY WIRELESS POWER TRANSMISSION OR AMBIENT RF ENERGY HARVESTING

(71) Applicant: National University of Singapore, Singapore (SG)

(72) Inventors: Yong Xin Guo, Singapore (SG); Zheng Zhong, Singapore (SG); Hucheng Sun, Singapore (SG)

(73) Assignee: National University of Singapore, Singapore (SG)

( * ) Notice: Subject to any disclaimer, the term of this patent is extended or adjusted under 35 U.S.C. 154(b) by 455 days.

(21) Appl. No.: 14/767,125

(22) PCT Filed: Feb. 27, 2014

(86) PCT No.: PCT/SG2014/000091
§ 371 (c)(1),
(2) Date: Aug. 11, 2015

(87) PCT Pub. No.: WO2014/133461
PCT Pub. Date: Sep. 4, 2014

(65) Prior Publication Data
US 2015/0372541 A1  Dec. 24, 2015

Related U.S. Application Data

(60) Provisional application No. 61/769,837, filed on Feb. 27, 2013, provisional application No. 61/956,998, (Continued)

(51) Int. Cl.
*H02J 17/00* (2006.01)
*H02M 1/32* (2007.01)
(Continued)

(52) U.S. Cl.
CPC .............. *H02J 50/27* (2016.02); *H02J 7/025* (2013.01); *H02J 17/00* (2013.01); *H02J 50/50* (2016.02);
(Continued)

(58) Field of Classification Search
CPC .......... H02J 17/00; H02M 7/217; H02M 1/32; H03H 7/383
(Continued)

(56) References Cited

U.S. PATENT DOCUMENTS 8,330,551 B2 * 12/2012 Lim ........................ H03F 1/565
330/302
2016/0020631 A1 * 1/2016 Manova-Elssibony ......................
H02J 17/00
320/107

FOREIGN PATENT DOCUMENTS

CN          101686018 A       3/2010

OTHER PUBLICATIONS

Marian, et al., "Potentials of an Adaptive Rectenna Circuit", IEEE Antennas and Wireless Propagation Letters, vol. 10, 2011.
(Continued)

*Primary Examiner* — Jared Fureman
*Assistant Examiner* — Joel Barnett
(74) *Attorney, Agent, or Firm* — Cesari and McKenna, LLP; James A. Blanchette

(57) ABSTRACT

A rectenna includes (a) a multi-band multi-channel (MBMC) matching network, and/or (b) an adaptively reconfigurable rectifier or a breakdown-protected rectifier. An MBMC matching network includes a plurality of T-shaped transmission line matching structures coupled in series. An adaptively reconfigurable rectifier circuit includes a low input power rectifying portion, a high input power rectifying portion, and a set of transistors configured for selectively
(Continued)

and automatically transitioning the adaptively reconfigurable rectifier between a low input power operating configuration and a high input RF power operating configuration, in a manner correlated with input RF power level. A breakdown-protected rectifier includes a transistor-protected diode structure having a diode coupled to a transistor in a manner that protects the diode from direct exposure to negative voltages that would ordinarily cause the diode to break down in the absence of the transistor.

22 Claims, 22 Drawing Sheets

Related U.S. Application Data filed on Jun. 21, 2013, provisional application No. 61/856,791, filed on Jul. 22, 2013.

(51) Int. Cl.
| | |
|---|---|
| H02J 50/27 | (2016.01) |
| H02J 50/50 | (2016.01) |
| H02J 7/02 | (2016.01) |
| H03H 7/38 | (2006.01) |
| H02M 7/217 | (2006.01) |

(52) U.S. Cl.
CPC .............. *H02M 1/32* (2013.01); *H02M 7/217* (2013.01); *H03H 7/383* (2013.01)

(58) Field of Classification Search
USPC ........................................................ 307/104
See application file for complete search history.

(56) References Cited

OTHER PUBLICATIONS

Mcspadden, et al., "Design and Experiments of a High-Conversion-Efficiency 5.8-GHz Rectenna", IEEE Transactions on Microwave Theory and Techniques, vol. 46, No. 12, Dec. 1998.

Nikravan, et al., "T-section dual-based impedance transformer for frequency-dependent complex impedance loads", Electronic Letters, vol. 47, No. 9, Apr. 28, 2011.

Suh, et al., "A High-Efficiency Dual Frequency Rectenna for 2.45- and 5.8-GHz Wireless Power Transmission", IEEE Transactions on Microwave Theory and Techniques, vol. 50, No. 7, Jul. 2002.

Visser, et al., "Ambient RF Energy Scavenfing: GSM and WLAN Power Density Measurements", Proceedings of the 38$^{th}$ European Microwave Converence, Oct. 2008.

Qaroot, et al., "Design and analysis of dual-frequency modified 3-way bagley power dividers", Progress in Electromagnetics Research C, vol. 20, pp. 67-81, 2011.

\* cited by examiner

410a

410b

410c

410d

410e

410f

410g

410h

000
RECTENNA CIRCUIT ELEMENTS, CIRCUITS, AND TECHNIQUES FOR ENHANCED EFFICIENCY WIRELESS POWER TRANSMISSION OR AMBIENT RF ENERGY HARVESTING

CROSS REFERENCE TO RELATED APPLICATIONS

This application is the National Stage of International Application No. PCT/SG2014/000091, filed on Feb. 27, 2014, which claims the benefit of U.S. Provisional Application Nos. 61/769,837, filed on Feb. 27, 2013, 61/956,998, filed on Jun. 21, 2013, and 61/856,791, filed on Jul. 22, 2013. The contents of all prior applications are hereby incorporated by reference in their entirety.

TECHNICAL FIELD

Aspects of the present disclosure are directed to rectenna circuit elements, circuits, and techniques for enhancing power conversion efficiency (PCE) in wireless power transmission (WPT) or ambient RF energy harvesting circuits by way of (a) a multi-band multi-channel (MBMC) RF matching network, and/or (b) an extended input power range rectifier, which can include an adaptively reconfigurable rectifier or a breakdown-protected rectifier.

BACKGROUND

Wireless Power Transfer (WPT) involves the transfer of RF electrical energy from a predetermined source, or particular types or sources, to a receiving antenna that is coupled to a rectifier. The combination of the receiving antenna and the rectifier is known as a rectenna. The rectenna converts received RF energy into DC power, which can be used to power a system or device, such as a sensor or a medical device. Ambient RF energy harvesting involves the collection of RF energy that is inherently present in modern environments as a result of wireless communication between one or more types of wireless systems and devices (e.g., public wireless telecommunication base stations and mobile telephones/smartphones), such that RF energy which would otherwise be wasted can be put to use, such as for battery recharging. As with WPT, ambient RF energy harvesting relies upon a rectenna, which converts harvested RF energy into DC power.

FIG. 1 is a schematic illustration of a conventional rectenna that is configured for receiving RF energy within a single RF frequency band, and converting RF energy within this single frequency band to DC power. Because this rectenna is limited to a single RF frequency band, RF energies outside of the single frequency band for which the rectenna is designed cannot be converted into DC power, thereby limiting the utility of this conventional rectenna in WPT and/or RF energy harvesting applications. For instance, various types of implantable medical devices, such as implantable pulse generators, have a power source such as a battery that needs to be recharged. For implanted medical devices, instantaneous RF power applied to the human body must be maintained below a predetermined level for safety purposes. Hence, it is desirable to utilize multiple RF frequency bands to apply pulsed RF power in a simultaneous manner for recharging implanted power sources. Additionally, for RF energy harvesting applications, it is desirable to simultaneously harvest RF energy within multiple frequency bands in a simultaneous manner, in order to enhance or maximize the conversion of available ambient RF energy into DC power.

Multi-frequency rectennas have been developed; however, such rectennas typically utilize multiple antennas and multiple rectifiers, with each antenna and its associated rectifier corresponding to a particular RF frequency band. Consequently, such conventional multi-frequency rectenna designs result in less efficient RF energy conversion, and increased space and cost.

The RF-to-DC power conversion efficiency of a rectenna critically depends on the nature of the rectifier therein. FIG. 2A is a schematic illustration of a conventional rectenna based upon a conventional rectifier, which is suitable for low. RF input power conditions. More particularly, for this rectenna, RF-to-DC power conversion efficiency (PCE) increases linearly with input RF power until input RF power exceeds the breakdown voltage of diode D1, after which RF-to-DC PCE degrades rapidly.

FIG. 2B is a schematic illustration of a conventional rectenna that utilizes a conventional high RF input power rectifier. For the rectenna of FIG. 2B, a set of diodes D2 (e.g., a total of four diodes, arranged pairwise in parallel) is coupled in series with diode D1, thereby extending the overall breakdown voltage of the combination of diode D1 and the set of diodes D2. Unfortunately, this rectenna exhibits undesirably low RF-to-DC PCE at low input RF power levels.

FIG. 2C is a schematic illustration of conventional rectenna that utilizes another type of conventional low RF input power rectifier. Here again, once the input RF power exceeds the breakdown voltage of diode D1, the RF-to-DC PCE of this rectenna degrades rapidly.

A need exists for a rectenna that utilizes a single antenna and a single rectifier, and which exhibits enhanced RF-to-DC PCE across a significantly wider range of input RF operating power conditions compared to prior rectennas.

SUMMARY

Figure 1:
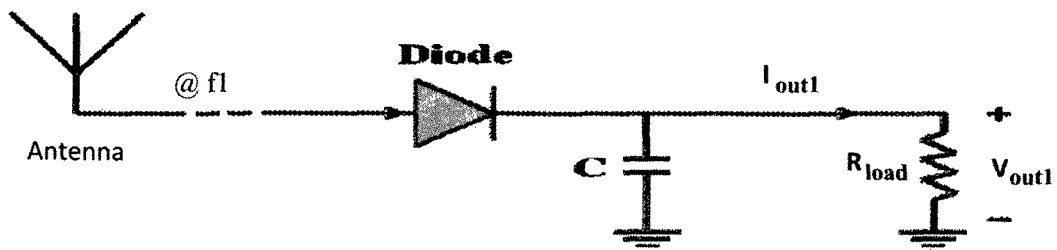
FIG. 1 is a schematic illustration of a conventional rectenna

In accordance with an aspect of the present disclosure, a circuit configured for receiving RF energy distributed in multiple RF frequency bands includes a multi-band multi-channel (MBMC) matching network. The MBMC matching network includes: a plurality of T-shaped transmission line matching structures, each T-shaped transmission line matching structure coupled in series to another T-shaped transmission line matching structure, wherein each T-shaped transmission line matching structure includes a first portion, a second portion, and a third portion coupled between the first portion and the second portion, and wherein the first portion of a first T-shaped transmission line matching structure within the plurality of T-shaped transmission line structures forms an input of the MBMC matching network, the second portion of a second T-shaped transmission line matching structure within the plurality of T-shaped transmission line matching structures forms an output of the MBMC matching network, and the third portion of at least one T-shaped transmission line matching structure within the plurality of T-shaped transmission line matching structures is couplable to electrical ground.

Each individual T-shaped transmission line matching structure within the MBMC matching network is configured for providing an impedance match corresponding to RF frequencies within a particular RF frequency band. The circuit can form a portion of a wireless power transmission (WPT) system or a portion of an ambient RF energy harvesting system.

The circuit can include or be a rectenna, which includes: an antenna coupled, to the input of the MBMC matching network; and a rectifier coupled to the output of the MBMC matching network. The rectifier includes one of: (a) an adaptively reconfigurable rectifier having a low input RF power rectifying portion, a high input RF power rectifying portion, and a set of transistors coupled to one of the high input RF power rectifying portion the low input RF power rectifying portion, the set of transistors configured for automatically transitioning the adaptively reconfigurable rectifier between a low input RF input power operating configuration and a high input RF power operating configuration based upon input RF power level; and (b) a breakdown-protected rectifier having at least transistor-protected diode structure, the transistor-protected diode structure comprising at least one diode coupled to a transistor in a manner that protects the diode from direct exposure to negative voltages that would ordinarily cause the diode to break down in the absence of the transistor.

In accordance with another aspect of the present disclosure, a circuit configured for rectifying signals (e.g., wirelessly received RF signals) includes one of: (a) an adaptively reconfigurable rectifier having a low input power rectifying portion, a high input power rectifying portion, and a set of transistors coupled to one of the high input power rectifying portion the low input power rectifying portion, the set of transistors configured for selectively and automatically transitioning the adaptively reconfigurable rectifier between a low input power operating configuration and a high input RF power operating configuration in a manner correlated with a power level of a signal input to the circuit; and (b) a breakdown-protected rectifier having at least one transistor-protected diode structure, the at least one transistor-protected diode structure comprising a first diode coupled to a transistor in a manner that protects the first diode from direct exposure to negative voltages that would ordinarily cause the diode to break down in the absence of the transistor.

In various embodiments, the low input power portion and the high input power portion of the adaptively reconfigurable rectifier are coupled in series, and the set of transistors of the adaptively reconfigurable is be coupled in parallel with the high input power portion. A control terminal of each transistor within the set of transistors is coupled to electrical ground. The set of transistors of the adaptively reconfigurable rectifier can include a plurality of transistors coupled to each other in series. Each transistor within the set of transistors can be a Field Effect Transistor (FET) (e.g., a MOSFET, a MESFET, or another type of FET).

In various embodiments, the low input power rectifying portion of the adaptively reconfigurable rectifier includes a first set of diodes, and the high input power rectifying portion includes a second set of diodes. At least one of the first set of diodes and the second set of diodes can include a plurality of diodes.

The breakdown-protected rectifier includes a first transistor-protected diode structure including a first diode and a transistor, wherein the transistor includes a control terminal coupled to the anode of the first diode, a first terminal coupled to the cathode of the first diode, and a second terminal couplable to circuitry external to the transistor-protected diode structure. The anode of the first diode is coupled to an input of the breakdown-protected rectifier and is configured to receive an alternating current (AC) signal, and wherein the second terminal of the transistor is coupled to an output of the breakdown-protected rectifier.

The transistor-protected diode structure can further include a second diode coupled in parallel with the second terminal and the third terminal of the transistor, such that the anode of the second diode is coupled to the cathode of the first diode. The transistor-protected diode structure can additionally or alternatively includes another diode having its anode coupled to the anode of the first diode, and its cathode coupled to the control terminal of the transistor.

In some embodiments, the breakdown-protected rectifier includes the first transistor-protected diode structure combined with a second transistor-protected diode structure coupled in a cascaded manner to the first transistor-protected diode structure, such that a negative voltage across the combination of the first and second transistor-protected diode structures is distributed across the transistor of the first transistor-protected diode structure and a transistor of the second transistor-protected diode structure. The second transistor-protected diode structure includes a first diode and a transistor having a control input, a first terminal, and a second terminal, wherein the anode of the first diode of the second transistor-protected diode structure is coupled to the anode of the first diode of the first transistor-protected diode structure, the cathode of the first diode of the second transistor-protected diode structure is coupled to the second terminal of the transistor of the second diode-protected transistor structure, and the third terminal of the transistor of the second diode-protected transistor structure is coupled to the control input of the transistor of the first diode-protected transistor structure.

In accordance with another aspect of the present disclosure, a wireless network includes: a transmission (TX) stage configured for wirelessly transmitting electromagnetic signals; and a reception (RX) stage configured for receiving electromagnetic signals transmitted by the TX stage. The RX stage includes one of: (a) a multi-band multi-channel (MBMC) matching network having: a plurality of T-shaped transmission line matching structures, each T-shaped transmission line matching structure coupled in series to another T-shaped transmission line matching structure, wherein each T-shaped transmission line matching structure includes a first portion, a second portion, and a third portion coupled between the first portion and the second portion, and wherein the first portion of a first T-shaped transmission line matching structure within the plurality of T-shaped transmission line structures forms an input of the MBMC matching network, the second portion of a second T-shaped transmission line matching structure within the plurality of T-shaped transmission line matching structures forms an output of the MBMC matching network, and the third portion of at least one T-shaped transmission line matching structure within the plurality of T-shaped transmission line matching structures is couplable to electrical ground; (b) an adaptively reconfigurable rectifier having a low input power rectifying portion, a high input power rectifying portion, and a set of transistors coupled to one of the high input power rectifying portion the low input power rectifying portion, the set of transistors configured for selectively and automatically transitioning the adaptively reconfigurable rectifier between a low input power operating configuration and a high input RF power operating configuration in a manner correlated with a power level of a signal input to the RX stage; and (c) a breakdown-protected rectifier having at least one transistor-protected diode structure, the at least one transistor-protected diode structure comprising a first diode coupled to a transistor in a manner that protects the first diode from direct exposure to negative voltages that would, ordinarily cause the diode to break down in the absence of the transistor. In some embodiments, the RX stage includes the MBMC matching network and one of the adaptively reconfigurable rectifier and the breakdown-protected rectifier.

The wireless network can further include one or more repeater/amplification stages configured to receive electromagnetic signals from the TX stage and transmit electromagnetic signals to the RX stage. One or more of the repeater/amplification: stages include one of: (a) a multi-band multi-channel (MBMC) matching network having: a plurality of T-shaped transmission line matching structures, each T-shaped transmission line matching structure coupled in series to another T-shaped transmission line matching structure, wherein each T-shaped transmission line matching structure includes a first portion, a second portion, and a third portion coupled between the first portion and the second portion, and wherein the first portion of a first T-shaped transmission line matching structure within the plurality of T-shaped transmission line structures forms an input of the MBMC matching network, the second portion of a second T-shaped transmission line matching structure within the plurality of T-shaped transmission line matching structures forms an output of the MBMC matching network, and the third portion of at least one T-shaped transmission line matching structure within the plurality of T-shaped transmission line matching structures is couplable to electrical ground; (b) an adaptively reconfigurable rectifier having a low input power rectifying portion, a high input power rectifying portion, and a set of transistors coupled to one of the high input power rectifying portion the low input power rectifying portion, the set of transistors configured for selectively and automatically transitioning the adaptively reconfigurable rectifier between a low input power operating configuration and a high input RF power operating configuration in a manner correlated with a power level of a signal input to the RX stage; and (c) a breakdown-protected rectifier having at least one transistor-protected diode structure, the at least one transistor-protected diode structure comprising a first diode coupled to a transistor in a manner that protects the first diode from direct exposure to negative voltages that would ordinarily cause the diode to break down in the absence of the transistor. In some embodiments, at least one repeater/amplification stage includes an MBMC matching network and one of an adaptively reconfigurable rectifier and a breakdown-protected rectifier.

DETAILED DESCRIPTION

In the present disclosure, depiction of a given element or consideration or use of a particular element number in a particular FIG. or a reference thereto in corresponding descriptive material can encompass the same, an equivalent, or an analogous element or element number identified in another FIG. or descriptive material associated therewith. The use of "/" in a FIG. or associated text is understood to mean "and/or" unless otherwise indicated. The recitation of a particular numerical value or value range herein is understood to include or be a recitation of an approximate numerical value or value range, for instance, to within +/−20%, +/−15%, +/−10%, or +/−5%.

As used herein, the term "set" corresponds to or is defined as a non-empty finite organization of elements that mathematically exhibits a cardinality of at least 1 (i.e., a set as defined herein can correspond to a unit, singlet, or single element set, or a multiple element set), in accordance with known mathematical definitions (for instance, in a manner corresponding to that described in *An Introduction to Mathematical Reasoning: Numbers, Sets, and Functions*, "Chapter 11: Properties of Finite Sets" (e.g., as indicated on p. 140), by Peter J. Eccles, Cambridge University Press (1998)). In general, an element of a set can include or be a system, an apparatus, a device, a structure, an object, a circuit, a circuit element, a process, a physical parameter, or a value depending upon the type of set under consideration.

Embodiments in accordance with the present disclosure are directed to rectenna circuit elements, circuits, and techniques that facilitate or enable enhanced power conversion efficiency (PCE) in wireless power transmission (WPT) or ambient RF energy harvesting systems, devices, or circuits. More particularly, systems, devices, or circuits in accordance with various embodiments of the present disclosure include rectennas having (a) a multi-band multi-channel (MBMC) RF matching network, and/or (b) an extended input power range rectifier, which can include an adaptively reconfigurable rectifier circuit, or a breakdown-protected rectifier circuit, as further detailed below.

Representative Rectenna with MBMC Matching Network

Figure 3:
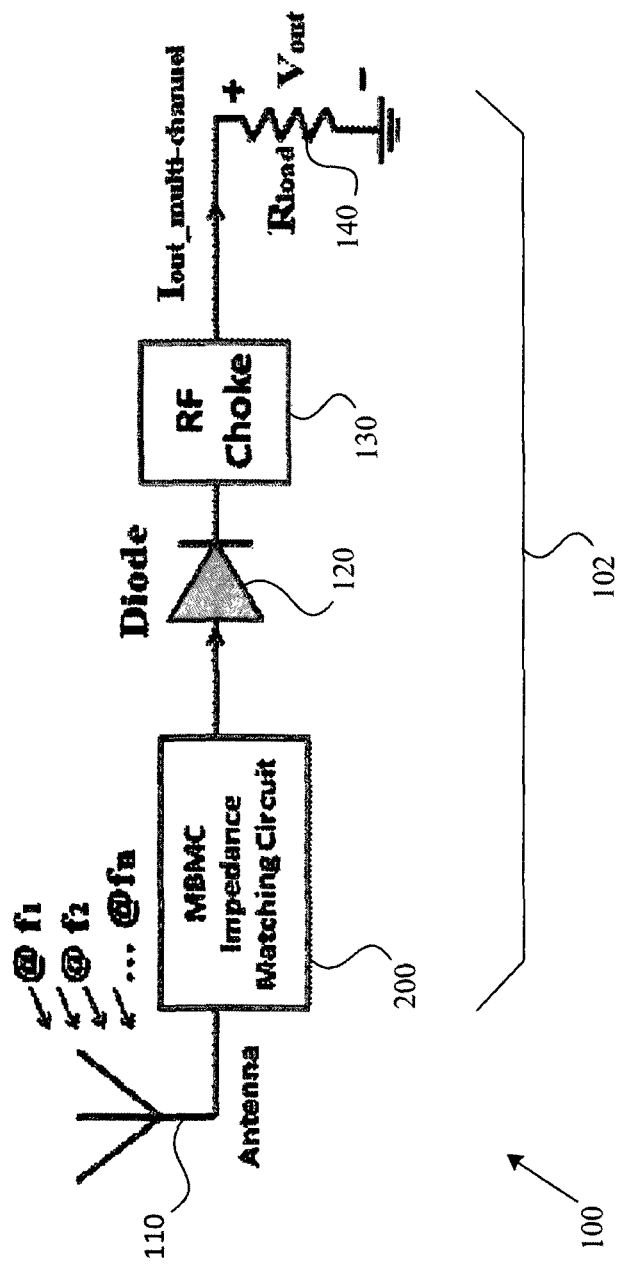
FIG. 3 is a schematic illustration of a representative multi-band multi-channel (MBMC) rectenna, which includes an MBMC matching network in accordance with an embodiment of the present disclosure.

FIG. 3 is a schematic illustration of a representative multi-band multi-channel (MBMC) rectenna 100 in accordance with an embodiment of the present disclosure. The MBMC rectenna 100 includes an antenna or antenna structure 110 configured for receiving RF energy corresponding to or spanning multiple RF frequency bands. The antenna 100 includes an output coupled to an input of an MBMC matching network 200, such that RF energy received by the antenna 110 is delivered to the MBMC matching network 200. The MBMC matching network 200 includes an output coupled to an input of a rectifier 120, which has an output coupled to an input of a DC pass filter or RF choke 130, and which further has an output coupled to a load resistance 140. Taken together, the MBMC matching network 200 and the rectifier 120, possibly in combination with the DC pass filter 130 and the load resistance 140, can be considered as or defined to be an MBMC rectifier 102.

The antenna 110 has a bandwidth spanning multiple RF frequency bands, for instance, multiple predetermined frequency bands suitable for a particular WPT application or an intended or expected RF energy harvesting environment under consideration. For instance, depending upon embodiment details, the antenna 110 can have a bandwidth suitable for receiving RF energy spanning multiple center frequencies across multiple frequency bands that are suitable or allocated for (a) recharging one or more types of implantable/implanted medical devices, such that the MBMC rectenna 100 can form a portion of a system, device, or circuit for WPT based medical device recharging; and/or (b) public/mobile telephony or wireless network communications, such that the MBMC rectenna 100 can form a portion of a system, device, or circuit for harvesting ambient RF energy corresponding to mobile telephony or other types of wireless communication signals that are known or expected to exist in a given modern urban environment.

To aid understanding, in a representative modern urban environment at the National University of Singapore campus, ambient power density was measured by way of a conventional wideband horn antenna (0.8-18 GHz) and a conventional spectrum analyzer. It was found that the ambient power density was dominated by downlink channel power in three public communication bands, namely, GSM-900, GSM-1800, and UTMS-2100, with corresponding measured values given in Table 1

TABLE 1

Measured Ambient Power Density across Each Channel of Different Public Telecommunication Bands

| Band | Downlink Frequency (MHz) | Received Power (dBm) | Antenna Gain (dBi) | Power Density (µW/m$^2$) |
|---|---|---|---|---|
| GSM-900 | 925-960 | −40~−30 | 2 | 7.1~71.4 |
| GSM-1800 | 1805-1880 | −30~−20 | 10 | 45.2~452.3 |
| UTMS-2100 | 2110-2170 | −30~−20 | 10 | 61.6~615.8 |

Furthermore, Table 1 indicates that the power densities in the GSM-1800 and UTMS-2100 bands were significantly larger than the power density in the GSM-900 band. Additionally, the total RF power of all ambient communication bands that the horn antenna received was measured by a power meter, which indicated a total ambient RF power of approximately −20 to −17 dBm (or approximately 10-20 µW).

Figure 4A:
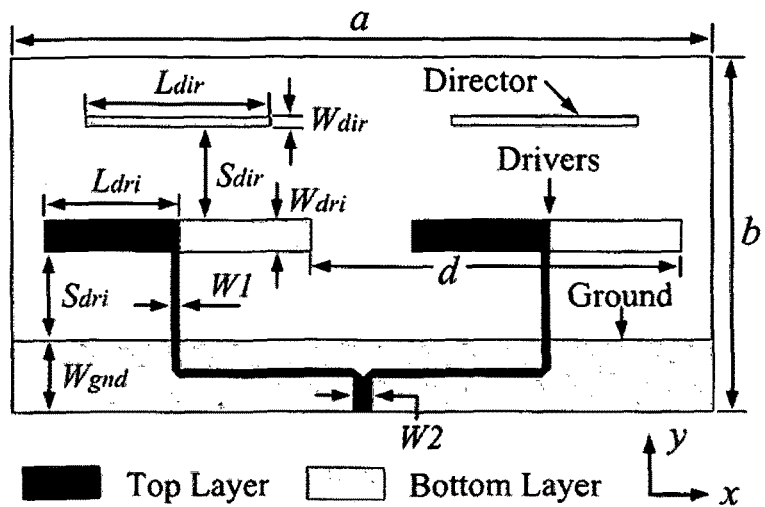
FIG. 4A is a top schematic illustration of a quasi-Yagi antenna 1×2 subarray in accordance with an embodiment of the present disclosure.

To further aid understanding, in a representative implementation directed to capturing RF power in the GSM-1800 and UTMS-2100 bands, the antenna 110 has a bandwidth that covers the Global System for Mobile (GSM) 1800 MHz frequency band, as well as the Universal Mobile Telecommunication System (UMTS) 2100 MHz frequency band. FIG. 4A is a top schematic illustration of a quasi-Yagi antenna 1×2 subarray, which indicates corresponding quasi-Yagi 1×2 antenna subarray design parameters. Two quasi-Yagi 1×2 antenna subarrays can be connected together with a T-junction power divider to form a 1×4 quasi-Yagi antenna array.

Figure 4B:
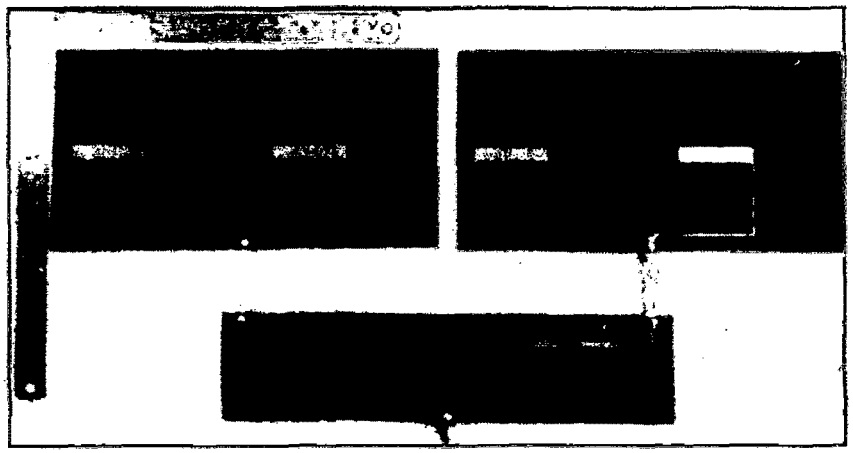
FIG. 4B is a front or top side image of a 1×4 quasi-Yagi antenna array having a bandwidth that covers each of the GSM-1800 and UTMS-2100 frequency bands, which is formed by connecting two quasi-Yagi 1×2 antenna subarrays of FIG. 4A together with a T-junction power divider in accordance with an embodiment of the present disclosure.
Figure 4C:
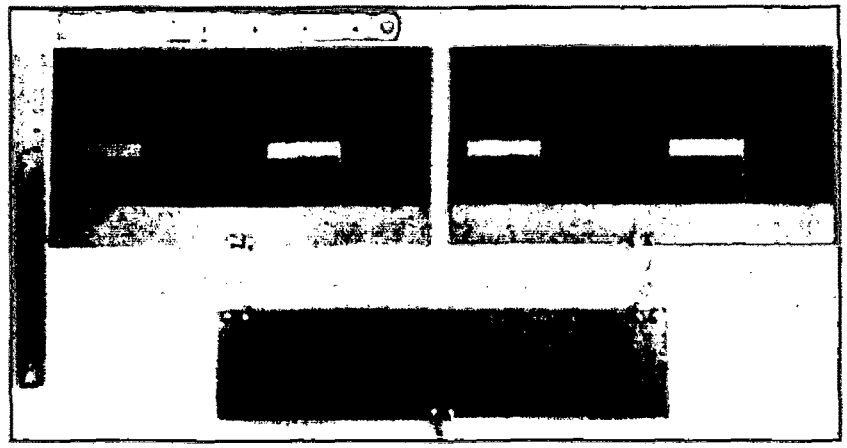
FIG. 4C is a back or bottom side image of the 1×4 quasi-Yagi antenna array of FIG. 4B.

FIG. 4B is a front or top side image of a 1×4 quasi-Yagi antenna array, and FIG. 4C is a back or bottom side image of the 1×4 quasi-Yagi antenna array in accordance with an embodiment of the present disclosure, which forms an antenna 110 having a bandwidth that covers each of the GSM-1800 and UMTS-2100 bands. More particularly, using values for the 1×2 quasi-Yagi antenna sub-array parameters indicated in FIG. 4A, in millimeters, of a=190, b=100, $W_1$=1.2, $W_2$=4.4, $W_{gnd}$=20, $L_{dri}$=37, $W_{dri}$=8, $L_{dir}$=50, $W_{dri}$=0.5, $S_{dir}$=26, $S_{dri}$=24, and d=100, the 1×4 quasi-Yagi antenna array exhibits a −10 dB bandwidth from approximately 1.8 GHz to 2.2 GHz as indicated in FIG. 4D, which illustrates simulated and measured |S$_{11}$| and gain of this representative implementation of the antenna 110. An individual having ordinary skill in the relevant art will readily recognize that the antenna 110 can exhibit other parameter values or other types of designs, based upon an intended rectenna application or environment under consideration, and a plurality of RF frequency bands associated therewith. For instance, in an RF energy harvesting application, the antenna 110 can be a conventional broadband or wideband antenna, such as a wideband horn antenna.

The MBMC matching network 200 is configured for providing an impedance match between the antenna 110 and the rectifier 120 with respect to multiple RF frequency bands that fall within the antenna's bandwidth, for purpose of enhancing or maximizing the transfer of RF power within multiple RF frequency bands from the antenna 110 to the rectifier 120. More particularly, the MBMC matching network 200 is configured for providing an impedance match relative to multiple predetermined RF frequency bands (e.g., a plurality of RF frequency bands defined or set aside for a given purpose by a standards or regulatory agency/body) that fall within the bandwidth of the antenna 110. As a result, the MBMC impedance matching network 200 enhances the amount of RF power across multiple RF frequency bands that can be coupled into the rectifier 120.

In various embodiments, the MBMC matching network 200 includes a plurality of T-shaped transmission line matching structures, which are coupled in series between the input and the output of the MBMC matching network 200. More particularly, in several embodiments, the MBMC matching network 200 includes an individual T-shaped transmission line matching structure corresponding to each individual RF frequency band for which the MBMC matching network 200 is intended to provide an impedance match. Consequently, an MBMC matching network 200 in accordance with an embodiment of the present disclosure can easily and exactly perform complex MBMC impedance transforming/matching in view of a given set of RF frequency bands and impedance matching requirements under consideration. Furthermore, MBMC matching networks 200 in accordance with embodiments of the present disclosure can realize frequency-dependent complex impedance matching at any two or more arbitrary frequencies. Several (e.g., two, three, or more) T-shaped transmission line matching structures can be cascaded (e.g., serially coupled to each other) in order to satisfy or solve MBMC impedance matching requirements. Such combinations of T-shaped transmission line matching structures provide highly flexible MBMC impedance matching solutions with respect to any given complex impedance matching situation at hand. The concept of these combinations is simple and surprisingly effective, which facilitates the applicability and extendibility of embodiments in accordance with the present disclosure to the use of closed-form equations for such cascaded MBMC impedance matching topologies.

At least one of the T-shaped transmission line matching structures is additionally coupled to electrical ground to provide a DC path. To further aid understanding, an MBMC matching network embodiment that is configured to provide matching for two RF frequency bands (e.g., the GSM-1800 and UTMS-2100 frequency bands), and which correspondingly includes two T-shaped transmission line matching structures, is described in detail below.

Figure 5A:
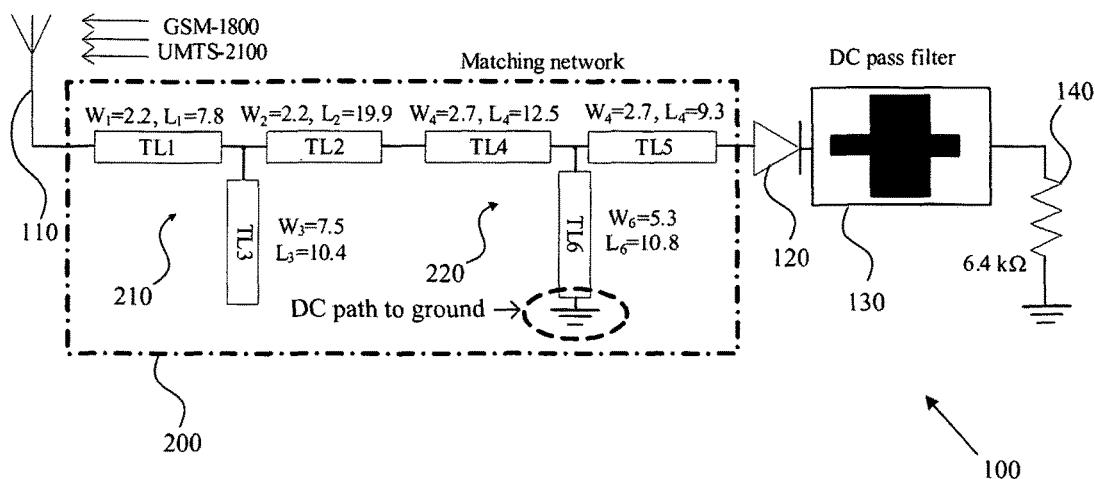
FIG. 5A is a schematic illustration of a representative embodiment of an MBMC matching network within an MBMC rectenna in accordance with an embodiment of the present disclosure.

FIG. 5A is a schematic illustration of a representative embodiment of an MBMC matching network 200 within an MBMC rectenna 100 in accordance with an embodiment of the present disclosure, where the MBMC matching network 200 is configured to provide impedance matching with respect to two RF frequency bands. Thus, this MBMC matching network 200 correspondingly includes a first 210 and a second 220 T-shaped transmission line matching structure. As indicated in FIG. 5A, each T-shaped transmission line matching structure 210, 220 includes three transmission lines. More specifically, the first T-shaped transmission line matching structure 210 includes (a) a first transmission line TL1 that forms a first or left portion, branch, leg, or side of the first T-shaped transmission line matching structure 210, and which provides an input of the MBMC matching network 200 that is coupled to the antenna 110; (b) a second transmission line TL2 coupled in series to the first transmission line TL1 in a manner that forms a second or right portion, branch, leg, or side of the first T-shaped transmission line matching structure 210, and which provides an output of the first T-shaped transmission line matching structure 210; and (c) a third transmission line TL3 coupled in parallel between the first transmission line TL1 and the second transmission line TL2, which forms a third portion, branch, leg, or side of the first T-shaped transmission line matching structure. In an analogous manner, the second T-shaped transmission line matching structure 220 includes (d) a fourth transmission line TL4 that forms a first or left portion, branch, leg, or side of the second T-shaped transmission line matching structure 220, which provides an input of the second T-shaped transmission line matching structure 220 that is coupled to the second transmission line TL2 of the first T-shaped transmission line matching structure 210; (e) a fifth transmission line TL5 coupled in series to the fourth transmission line TL4 in a manner that forms a second or right portion, branch, leg, or side of the second T-shaped transmission line matching structure 220, and which provides an output of the MBMC matching network 200; and (f) a sixth transmission line TL6 coupled in parallel between the fourth transmission line TL4 and the fifth transmission line TL5, which forms a third portion, branch, leg, or side of the second T-shaped transmission line matching structure. Additionally, a third portion, branch, leg, or side of at least one T-shaped transmission line matching structure is coupled to electrical ground. For instance, the sixth transmission line TL6, that is, the third portion of the second T-shaped transmission line matching structure, can be coupled to electrical ground.

Figure 5B:
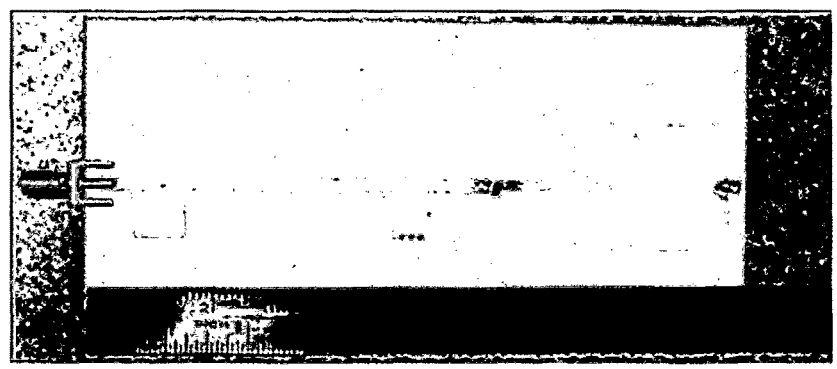
FIG. 5B is an image of an as-fabricated representative implementation of this MBMC matching network in accordance with an embodiment of the present disclosure.

FIG. 5A further indicates the width and length of each of the first through sixth transmission lines TL1-TL6 for a representative implementation of the MBMC matching network 200 configured to provide impedance matching with respect to the GSM-1800 frequency band and the UTMS-2100 frequency band. FIG. 5B is an image of an as-fabricated implementation the MBMC rectifier 102, which includes this representative implementation of the MBMC matching network 200 having first through sixth transmission lines TL1-TL6 fabricated with the dimensions indicated in FIG. 5A; a conventional Schottky diode (e.g., an Avago HSMS-2852, $C_j$=0.18 pF, $R_s$=25Ω, Avago Technologies, Singapore) coupled to the output of the fifth transmission line TL5; and a DC pass filter 130 coupled to the Schottky diode. The DC pass filter 130 is implemented as a conventional stepped-impedance microstrip low pass filter. Each of the aforementioned elements was fabricated on a conventional circuit board, such as an RO4003 32 mil high frequency laminate circuit board (Rogers Corporation, Rogers, Conn. USA). Additionally, for this representative implementation, the resistive load 140 is a 6.4 kΩ resistor.

Figure 6:
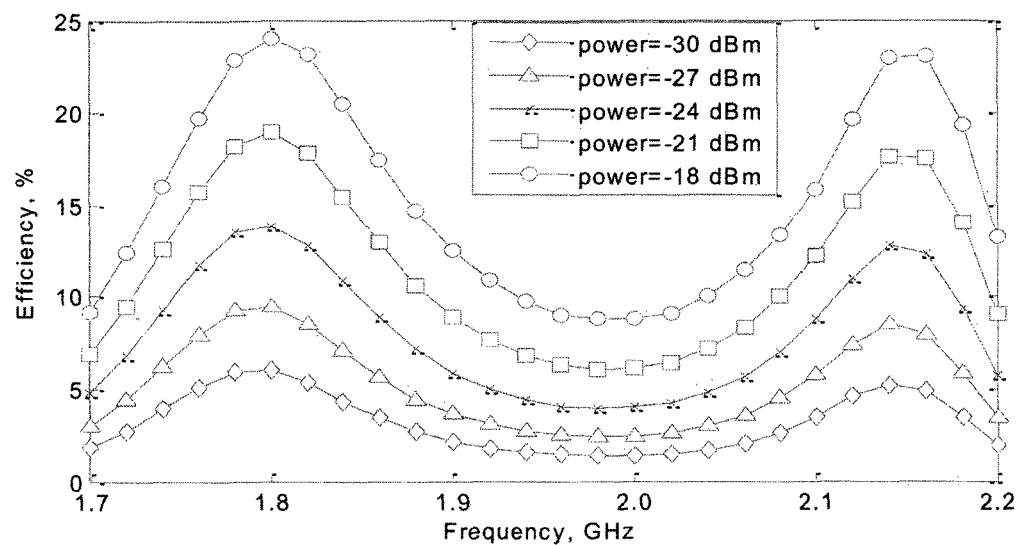
FIG. 6 plots measured RF-to-DC PCE against frequency at different power levels (−30 dBm to −18 dBM) for a representative implementation of the MBMC rectenna of FIG. 3.

To verify the frequency-power characteristics or performance of a rectenna 100 implemented as set forth above, single tone RF-to-DC power conversion efficiency (PCE) was tested using a signal generator (e.g., an Agilent E8257D, Agilent Technologies, Palo Alto, Calif. USA). FIG. 6 plots measured RF-to-DC PCE against frequency at different input RF power levels (−30 dBm to −18 dBM) for the representative implementation of the MBMC rectenna 100. As indicated in FIG. 6, a higher PCE is achieved at approximately 1.80-1.88 GHz and approximately 2.11-2.17 GHz than for other frequency bands, for all power levels, in accordance with intended objectives for the representative implementation of the MBMC rectenna 100. Additionally, it will be readily understood by one having ordinary skill in the relevant art that when multiple or several channels in either of the 1.80-1.88 GHz band or the 2.11-2.17 GHZ band are activated, the RF power in such channels can be simultaneously converted to DC power at an enhanced or high PCE.

Figure 7:
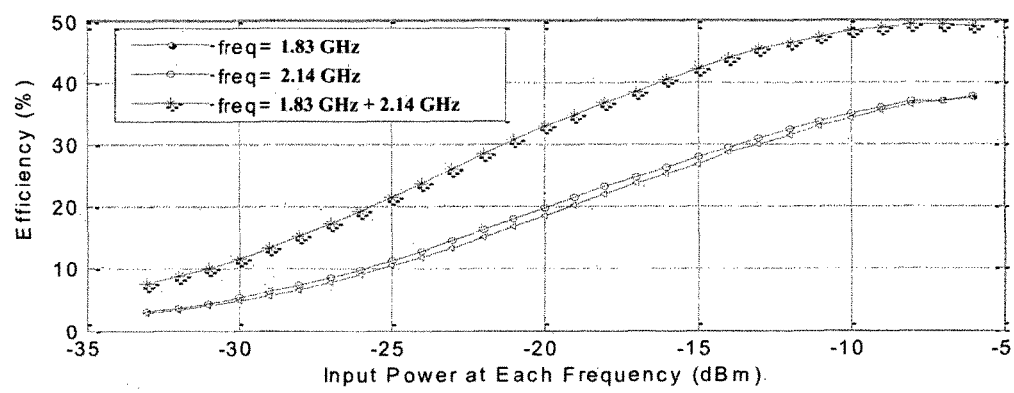
FIG. 7 plots measured PCE against single and dual-tone input power for input signal frequencies of 1.83 GHz and 2.14 GHz, which are the approximate center frequencies of the 1.80-1.88 GHz and 2.11-2.17 GHz frequency bands, for the representative implementation of the MBMC rectenna of FIG. 3.

To further verify the PCE efficiency enhancement of this representative implementation of the MBMC rectenna 100, two-tone RF-to-DC PCE performance was also examined using two Agilent E8257D signal generators and a ZFRSC-42 power splitter (Mini-Circuits, Brooklyn, N.Y. USA). FIG. 7 plots measured PCE against single and dual-tone input power for input signal frequencies of 1.83 GHz and 2.14 GHz, which are the approximate center frequencies of the 1.80-1.88 GHz and 2.11-2.17 GHz frequency bands. For purpose of simplicity, the input power for each of these tone frequencies was identical, across a predetermined range of input powers.

As indicated in FIG. 7, RF-to-DC PCE is greater for dual tone input compared to single tone input across the tested range of input powers. Thus, the addition of RF input signals at different frequencies facilitates the generation of higher converted DC power and a higher PCE compared to single-tone RF input situations. FIG. 7 clearly indicates that the MBMC rectenna 100 can simultaneously harvest RF power that is dispersed among or across separate frequency bands and different channels within such frequency bands with an enhanced or considerably higher RF-to-DC PCE. Furthermore, when input power is approximately −30 dBm, which is expected to correspond to a relatively low ambient RF power level, the RF-to-DC PCE is only 5.29% and 4.79% for the individual 1.83 GHz and 2.14 GHz tones, respectively. However, the input of the corresponding two tone signal by way of simultaneous input of each of the 1.83 GHz and 2.14 GHz tones results in an RF-to-DC PCE of 11.65%, which surprisingly is more than twice the RF-to-DC PCE for either single tone input situation.

An additional representative implementation of the MBMC rectenna 100 was tested with respect to its ambient RF energy harvesting performance. In this additional representative implementation of the MBMC rectenna 100, the antenna 110 was a wideband antenna 100, rather than a dual band antenna. More specifically, in this additional representative implementation of the MBMC rectenna 100, the MBMC matching network 200 was connected to the same wideband horn antenna utilized for generating the measurements of Table 1. The MBMC rectenna 100 was also positioned in the same modern urban environment as that used for generating the measurements of Table 1.

As indicated in Table 2, for this additional representative implementation of the MCMC rectenna 100, received RF power was approximately −20 dBm, which is approximately 10 times greater than the −30 dBm relatively low ambient RF power level considered above for the dual tone situation. The output voltage of the rectifier 120 was approximately 120 mV. Therefore, the RF-to-DC PCE of this additional representative implementation of the MBMC rectenna 100 was approximately 22.5%, which greatly exceeds the RF-to-DC PCE measured for the above single tone situation, and which significantly exceeds the 11.65% RF-to-DC PCE measured for the above dual tone situation.

TABLE 2

Comparison of RF-to-dc PCE for single-tone, dual-tone, and multi-channel RF energy harvesting

| Frequency Band | Received Power (dBm) | RF-to-DC PCE (%) |
|---|---|---|
| Single tone (1.83 GHz) | −30 | 5.29 |
| Dual tone (1.83 & 2.14) | −30 | 11.65 |
| Urban area (multi-band multi-channel) | −20 | 22.5 |
| Nearby transmission tower | −15 | 38.8 |

Finally, the additional representative implementation of the MBMC rectenna 100 was positioned near a commercial mobile telephony transmission tower, where the ambient RF energy would clearly be higher than in a modern urban area that is away or distant from the mobile transmission tower. When positioned near the mobile transmission tower, the measured RF received power varied between approximately −15 dBm and −20 dBm, in accordance with RF energy variations in multiple channels of the GSM-1800 and UMTS-2100 bands. Additionally, in this high ambient RF energy environment, the maximum DC voltage output by the rectifier 120 was approximately 280 mV. The RF-to-DC PCE for this additional implementation of the MBMC rectenna 100 in the high ambient RF energy environment can be derived according to the maximum input power (−15 dBm, −0.032 mW) to be approximately 38.8%.

Aspects of Representative Rectenna Rectifier Architectures

In addition or as an alternative to the foregoing, various embodiments in accordance with the present disclosure can enhance rectenna RF-to-DC PCE by way of a rectifier that can operate over an extended input power range. Depending upon embodiment details, an extended input power range rectifier can be, an adaptively reconfigurable rectifier, or a breakdown-protected rectifier, as described in detail hereafter.

Adaptively Reconfigurable Rectifier

Figure 8A:
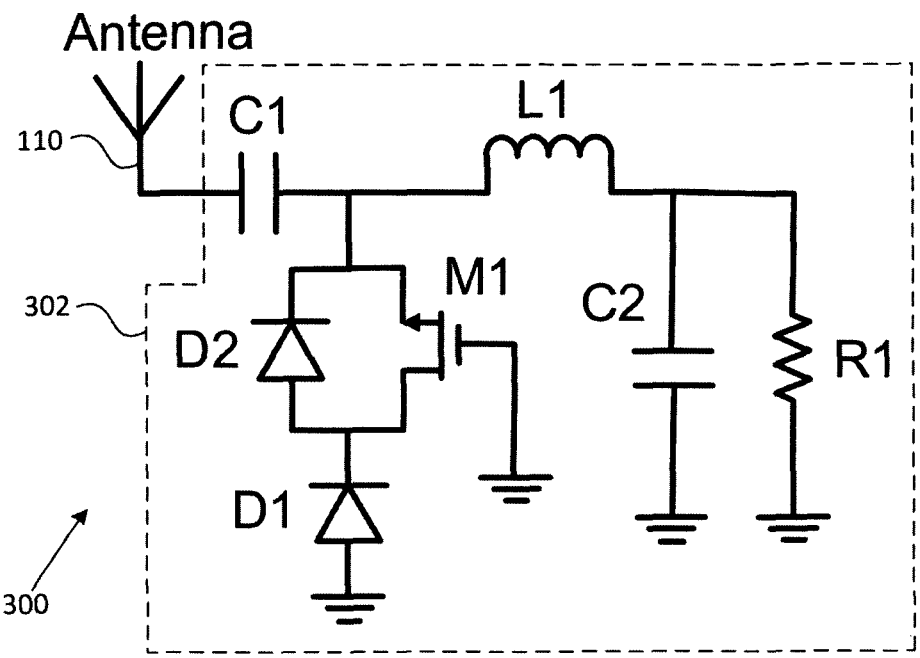
FIG. 8A is a schematic illustration of an adaptively reconfigurable rectenna or adaptive rectenna based upon a first adaptively reconfigurable rectifier or first adaptive rectifier in accordance with an embodiment of the present disclosure.

FIG. 8A is a schematic illustration of an adaptively reconfigurable rectenna or adaptive rectenna 300 based upon a first adaptively reconfigurable rectifier or first adaptive rectifier 302 in accordance with an embodiment of the present disclosure. Compared to the conventional high RF input power rectifier circuit shown in FIG. 2B, the first adaptively reconfigurable rectifier 302 includes a transistor 310 coupled in parallel with the set of diodes D2. More particularly, in several embodiments the transistor 310 is a MOSFET having its gate coupled to ground; its drain and source coupled in parallel with the set of diodes D2 (e.g., its drain can be coupled to the output of D1, and its source can be coupled between C1 and L1.

Because the gate of the MOSFET 310 is maintained at ground potential, the MOSFET's gate-to-source voltage ($V_{gs}$) is equal to the inverse of the DC voltage output across load resistor R1. Consequently, the MOSFET 310 can serve as an adaptive switch that automatically selectively shunts the set of diodes D2 based upon the DC voltage output across load resistor R1. More particularly, in a representative implementation, the MOSFET 310 is an n-channel depletion mode MOSFET, such as an NE3210S01 (NEC Corporation, Tokyo, Japan). When the input RF power is low, $V_{gs}$ is near 0 Volts, and the MOSFET 310 is in the ON state, thereby shunting the set of diodes D2. Under such operating conditions, the first adaptively reconfigurable rectifier 302 behaves like the conventional low input power rectifier shown in FIG. 2A. As input RF power increases, the DC voltage output across load resistor $R_L$ increases, $V_{gs}$ decreases, the MOSFET's channel resistance $R_{ds}$ rises, and resistive loss within the MOSFET 310 increases. This resistive loss results in a slight adverse effect on RF-to-DC PCE as input RF power increases from a low to a moderate level (in contrast to the conventional low RF input power rectifier shown in FIG. 2A).

As input RF power increases further, $V_{gs}$ eventually reaches the cutoff voltage of the MOSFET 310, and the MOSFET 310 is thus transitioned to its OFF state. Therefore, under higher/high input RF power conditions, the first adaptively reconfigurable rectifier 302 behaves like the conventional high input RF power rectifier shown in FIG. 2B. Thus, the MOSFET 310 automatically reconfigures the first adaptively reconfigurable rectifier 302 to a more efficient rectifier topology (i.e., a high RF input power rectifier topology) under high input RF power conditions. Analogously, the MOSFET 310 automatically reconfigures the first adaptively reconfigurable rectifier 302 to a more efficient rectifier topology (i.e., a low input RF power rectifier topology) under low input RF power conditions. The first adaptively reconfigurable rectenna 300 can thus exhibit a greatly or dramatically increased input RF power operating range compared to either of the conventional rectennas of FIGS. 2A and 2B.

Notwithstanding the foregoing, within or across a given or predetermined input RF power range, $V_{gs}$ is not sufficiently negative to completely turn off the MOSFET 310, thereby resulting in an amount of resistive loss that can be non-negligible. This resistive loss problem can be solved by another adaptive rectifier topology, as described in detail hereafter.

Figure 8B:
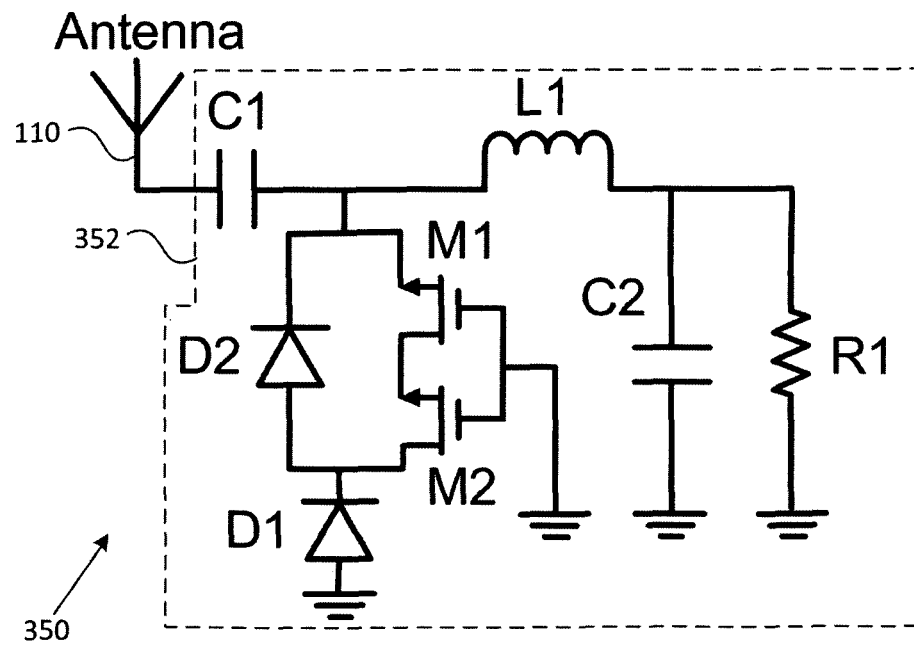
FIG. 8B is a schematic illustration of an adaptively reconfigurable rectenna or adaptive rectenna based upon a second adaptively reconfigurable rectifier or second adaptive rectifier in accordance with an embodiment of the present disclosure.

FIG. 8B is a schematic illustration of an adaptively reconfigurable rectenna or adaptive rectenna 350 based upon a second adaptively reconfigurable rectifier or second adaptive rectifier 352 in accordance with another embodiment of the present disclosure. In an embodiment, the second adaptively reconfigurable rectifier 352 includes two transistors 310, 312 coupled in parallel across the set of diodes D2, rather than a single transistor 310 coupled in parallel across the set of diodes D2, in order to overcome the aforementioned resistive loss problem. In several embodiments, the two transistors 310, 312 include a first and a second MOSFET 310, 312 coupled or connected in series, where the gate of each MOSFET 310, 312 is coupled to electrical ground. The source of the first MOSFET 310 is coupled between C1 and L1, and the drain of the first MOSFET 310 is coupled to the source of the second MOSFET 312. The source of the second MOSFET 312 is coupled to diode D1.

Figures 8C, 8D:
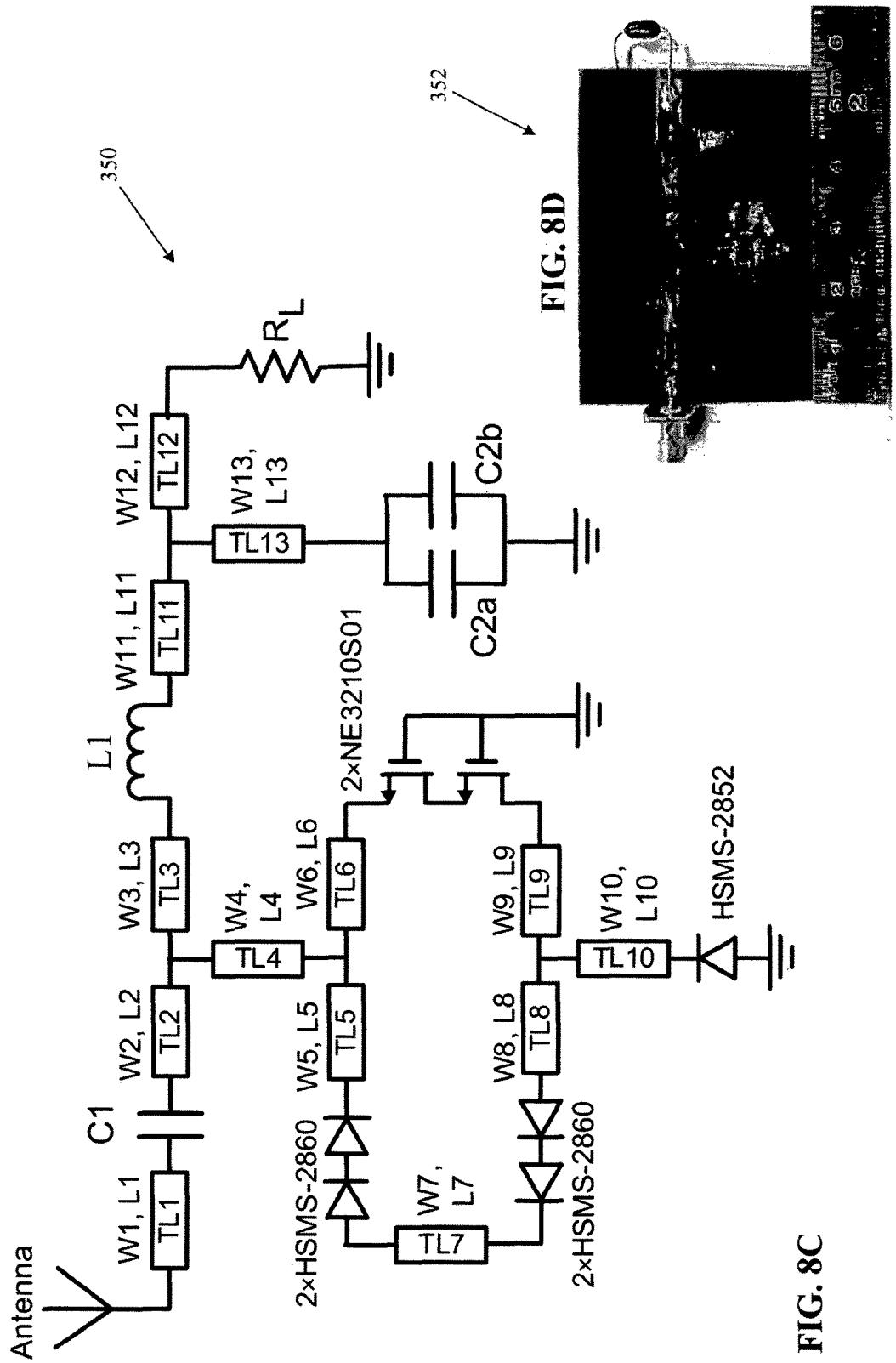
FIG. 8C illustrates a circuit configuration of a representative implementation of an adaptively reconfigurable rectifier shown FIG. 8B.
FIG. 8D is an image of the representative second adaptively reconfigurable rectifier of FIG. 8C, as-fabricated.

FIG. 8C illustrates a circuit configuration of a representative implementation of the second adaptively reconfigurable rectenna 350 of FIG. 8B, configured for operation at 100 MHz for purpose of example. In this representative implementation, diode D1 is an HSMS-2852 diode (Avago Technologies, Singapore); the set of diodes D2 is a set of four HSMS-2850 diodes, coupled pairwise between transmission line TL7 in the manner shown; and the first and second MOSFETS 310, 312 are NE2110S01 MOSFETS. (NEC Corporation, Tokyo, Japan). Additionally, C1 is 5.1 pF; L1 is 290 nH; and C2 is 100 pF. Transmission lines TL1 through TL13 have widths (W) and lengths. (L) as follows, in millimeters: W1=2.4; L1=15; W2=W3=3.5; L2=L3=7.5; W4=2; L4=13; W5=W6=W8=W9=0.7; L5=L6=L8=L9=3; W7=0.7; L7=1.8; W10=2; L10=1; W11=3; L11=7; W12=5; L12=8; W13=4; and L13=5. Additionally, $R_L$=2.8 kΩ. FIG. 8D is an image of the corresponding representative second adaptively reconfigurable rectifier 352, as fabricated on a 31 mil Rogers RT/duroid 5880 substrate having a dielectric constant of 2.2 and a loss tangent of 0.0012. One having ordinary skill in the relevant art will understand that depending upon embodiment and/or implementation details, diode D1 can be a set of diodes (i.e., one or more diodes); and/or the set of diodes D2 can be a single diode rather than multiple diodes.

Figure 2A:
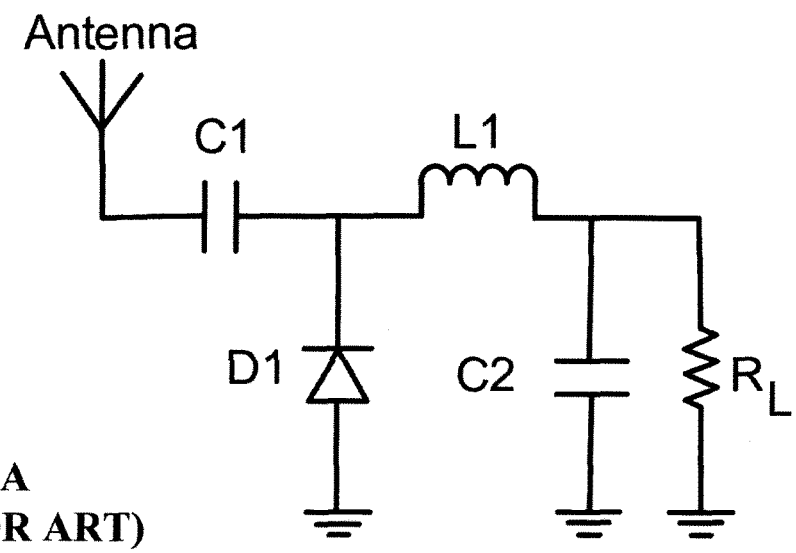
FIG. 2A is a schematic illustration of a conventional rectenna that utilizes a conventional low RF input power rectifier.
Figure 2B:
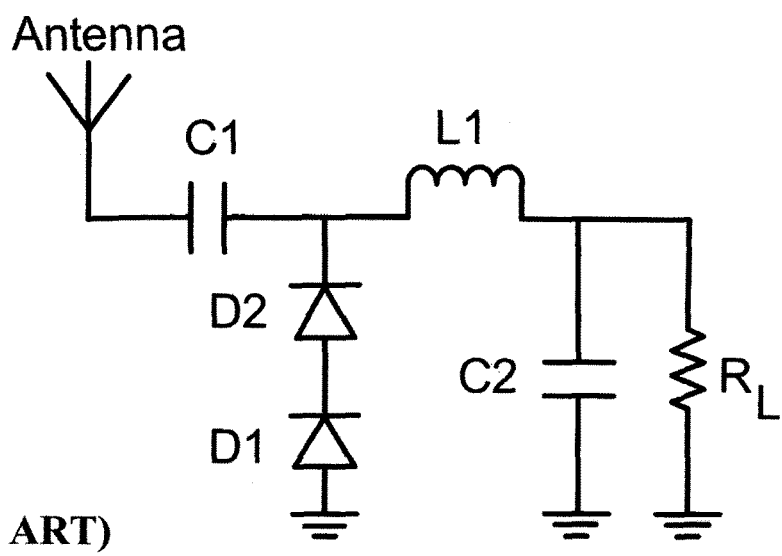
FIG. 2B is a schematic illustration of a conventional rectenna that utilizes a conventional high RF input power rectifier.

For comparison purposes, simulations of the RF-to-DC PCE versus input RF power for the conventional low RF input power rectifier shown in FIG. 2A, the conventional high RF input power rectifier shown in FIG. 2B, the first adaptively reconfigurable rectifier 302 shown in FIG. 8A, and the second adaptively reconfigurable rectifier 352 of FIG. 8B were performed using diode D1, the set of diodes D2, capacitors C1 and C2, inductance L1, and load resistance $R_L$ defined as given above. Each such simulation corresponded to an operating frequency of 100 MHz, for purpose of example.

Figure 9A:
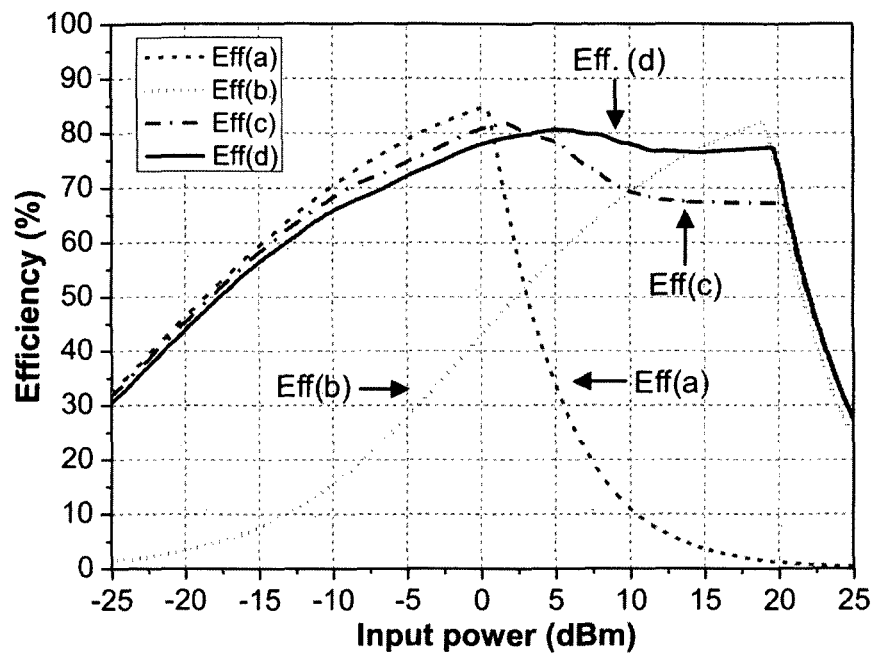
FIG. 9A is a graph showing RF-to-DC PCE simulation results for (a) the conventional low RF input power rectifier shown in FIG. 2A; (b) the conventional high RF input power rectifier shown in FIG. 2B; (c) the first adaptively reconfigurable rectifier shown in FIG. 8A; and (d) the second adaptively reconfigurable rectifier shown in FIG. 8B.

FIG. 9A is a graph showing RF-to-DC PCE simulation results for (a) the conventional low RF input power rectifier shown in FIG. 2A; (b) the conventional high RF input power rectifier shown in FIG. 2B; (c) the first adaptively reconfigurable rectifier 302 shown in FIG. 8A; and (d) the second adaptively reconfigurable rectifier 352 shown in FIG. 8B. From FIG. 9A, one can readily note the following:

(a) With respect to the Conventional low RF input power rectifier shown in FIG. 2A, it is clear that its RF-to-DC PCE increases with increasing input RF power until reaching a maximum of approximately 85% of input RF power at approximately 0.3 dBm. When the input RF power exceeds this level, the RF-to-DC PCE of the conventional rectifier shown in FIG. 2A decreases rapidly, since the voltage swing across D1 exceeds D1's breakdown voltage. Thus, the conventional low RF input power rectifier shown in FIG. 2A is suitable only for low input RF power situations, and is unsuitable for high input RF power situations.

(b) With respect to the conventional high RF input power rectifier shown in FIG. 2B, the RF-to-DC PCE at low RF input powers is less than that for the conventional low RF input power rectifier shown in FIG. 2A. For instance, when the input RF power is less than about −5 dBm, the RF-to-DC PCE of the conventional high RF input power rectifier remains below approximately 30%. However, the RF-to-DC PCE at high RF input powers is much better than that for the conventional low RF input power rectifier shown in FIG. 2A, reaching a peak of approximately 82% at about 19 dBm input RF power. Thus, the conventional rectifier shown FIG. 2B is suitable only for high input RF power situations.

(c) With respect to the first adaptively reconfigurable rectifier 302 shown in FIG. 8A, its RF-to-DC PCE generally matches that for the conventional rectifier shown in FIG. 2A for input RF power less than −15 dBm. As input RF power increases from approximately −15 dBm to approximately 0 dBm, the RF-to-DC PCE of the first adaptively reconfigurable rectifier 302 is slightly reduced compared to that of the conventional low RF input power rectifier because of the aforementioned resistive loss due to the MOSFET 310. When the input RF power exceeds approximately 10 dBm, $V_{gs}$ reaches the cutoff voltage of the MOSFET 310, thereby switching the MOSFET 310 to the OFF state. Under such high RF input power conditions, the first adaptively reconfigurable rectifier 302 operates in a manner that is generally similar or analogous to that of the conventional high RF input power rectifier of FIG. 2B.

(d) With respect to the second adaptively reconfigurable rectifier 352, FIG. 9 indicates that the second adaptively reconfigurable rectifier 352 achieves a better OFF state than the first adaptively reconfigurable rectifier 302 across a range of input RF power between approximately 3 dBm and 20 dBm. Thus, the second adaptively reconfigurable rectifier 352 provides significantly enhanced RF-to-DC PCE across a wide input RF power range, for instance, from approximately 3 dBm to 20 dBm, compared to the other rectifiers considered in this simulation.

In addition to the foregoing, the RF-to-DC PCE of the representative implementation of the second adaptively reconfigurable rectifier 352 shown in FIGS. 8C-8D was measured versus input RF power. More particularly, input RF power and DC voltage output across the resistive load $R_L$ were simultaneously measured, and the RF-to-DC PCE was calculated in accordance with the following equation:

$$\eta = (V_L)^2 / R_L \times (1/P_{in}) \times 100 \quad (1)$$

in a manner readily understood by those having ordinary skill in the relevant art.

Figure 9B:
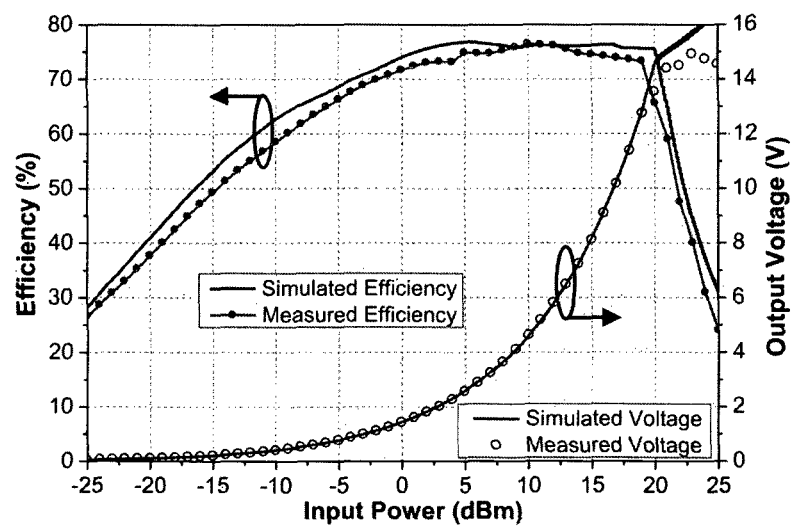
FIG. 9B is a graph showing measured versus simulated RF-to-DC PCE, as well as measured versus simulated output voltage, as a function of input RF power for a representative implementation of the second adaptively reconfigurable rectifier of FIGS. 8B-8D.

FIG. 9B is a graph showing measured versus simulated RF-to-DC PCE, as well as measured versus simulated output voltage, as a function of input RF power for the aforementioned representative implementation of the second adaptively reconfigurable rectifier 352. The measured and simulated results exhibit good agreement with each other. FIG. 9B indicates that an RF-to-DC PCE exceeding 50% can be achieved across an extended or enhanced input RF power range, from approximately −14 dBm to 21 dBm. Additionally, an RF-to-DC PCE greater than equal to approximately 75% can be reached for input RF powers between approximately 7 dBm and 14 dBm. Also, a highest DC output voltage of about 14.9V can be reached when input RF power approximately equals 23 dBm. The measured results shown in FIG. 9B clearly indicate that the second adaptively reconfigurable rectifier 352 is suitable for WPT and/or RF energy harvesting applications in which a wide operating input RF power range is desired or required.

Figure 9C:
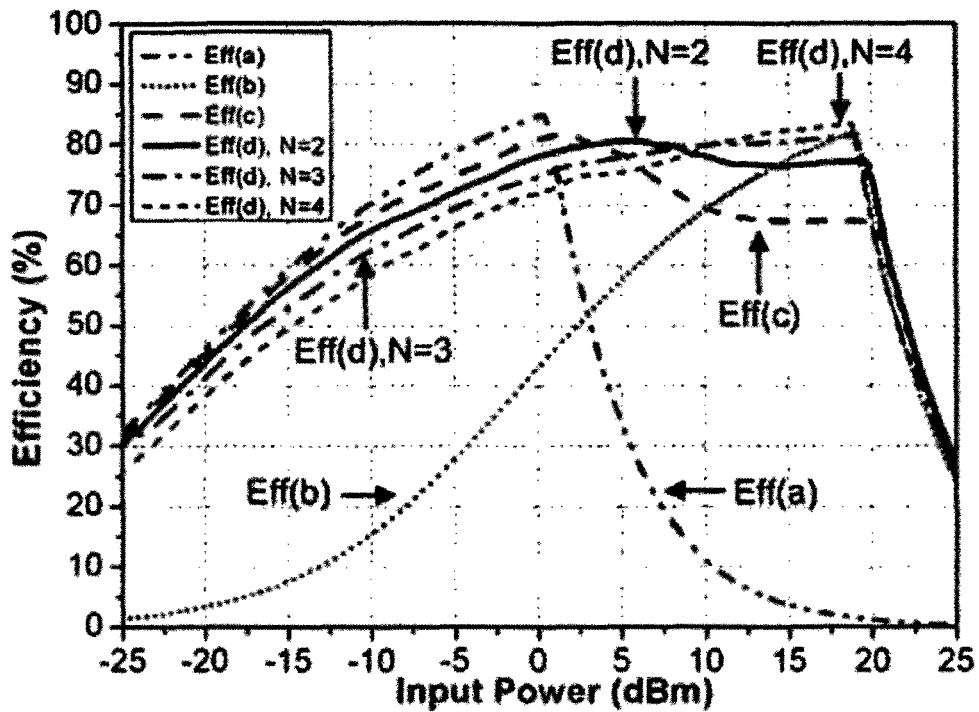
FIG. 9C is a graph showing simulated RF-to-DC PCE versus input RF power corresponding to FIG. 9A, but also including simulation results for an adaptively reconfigurable rectifier having three MOSFETs coupled across/in parallel with the set of diodes D2, as well as an adaptively reconfigurable rectifier having four MOSFETs coupled across/in parallel with the set of diodes D2.

Further to the foregoing, an adaptively reconfigurable rectifier can include more than two transistors (e.g., more than two MOSFETs) coupled in parallel with the set of diodes D2. For instance, an adaptively reconfigurable rectifier can include three, four, or more MOSFETs coupled in parallel with the set of diodes D2, where such MOSFETs are stacked in series. FIG. 9C is a graph showing simulated RF-to-DC PCE versus input RF power corresponding to FIG. 9A, but which also includes simulation results for an adaptively reconfigurable rectifier having three MOSFETs coupled across/in parallel with the set of diodes D2, as well as an adaptively reconfigurable rectifier having four MOSFETs coupled across/in parallel with the set of diodes D2. More particularly, FIG. 9C illustrates simulated RF-to-DC PCE versus input RF power for (a) the conventional low RF input power rectifier of FIG. 2A (indicated as "Eff(a)" in FIG. 9C); (b) the conventional high RF input power rectifier of FIG. 2B (indicated as "Eff(b)" in FIG. 9C); (c) the first adaptively reconfigurable rectifier 302 of FIG. 8A (indicated as "Eff(c)" in FIG. 9C); and (d) three versions of the second adaptively reconfigurable rectifier 352 of FIG. 8B, namely, (i) a version with N=2 MOSFETs 310, 312; a version with N=3 MOSFETs; and (iii) a version with N=4 MOSFETs (respectively indicated as "Eff(d) N=2", "Eff(d) N=3", and "Eff(d) N=4" in FIG. 9C), where such MOSFETs in each version are serially stacked and coupled in parallel with diode D1. FIG. 9C indicates that as the number of serially stacked MOSFETs increases, the RF-to-DC PCE tends to be higher in the high RF input power region, and lower in the low RF input power region.

Figure 9D:
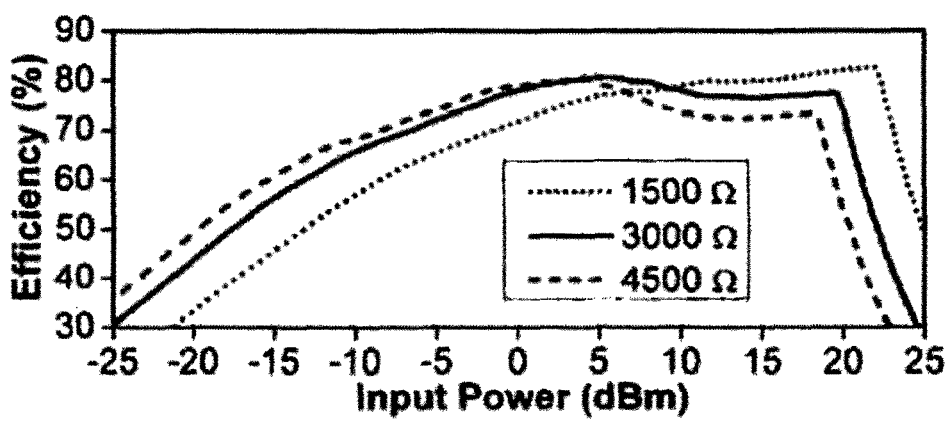
FIG. 9D is a graph of simulated RF-to-DC PCE versus RF input power for different values of the load resistance $R_L$ for the second adaptively reconfigurable rectifier 352.

Still further to the foregoing, FIG. 9D is a graph of simulated RF-to-DC PCE versus RF input power for different values of the load resistance $R_L$ for the second adaptively reconfigurable rectifier 352. FIG. 9D indicates that as load resistance $R_L$ increases, the RF-to-DC PCE tends to be higher in the low RF input power region, and lower in the high RF input power region.

Thus, there can be certain tradeoffs in terms of RF-to-DC PCE performance with respect to the number of MOSFETs stacked in series, and/or load resistance $R_L$. Furthermore, the threshold voltage of the MOSFET(s) should be selected such that under high RF input power conditions, the instantaneous $V_{gs}$ will turn the FET(s) off when the reverse bias across diode D1 approaches D1's breakdown voltage, as will be readily understood by one having ordinary skill in the relevant art.

Breakdown-Protected Rectifier

Figure 10A:
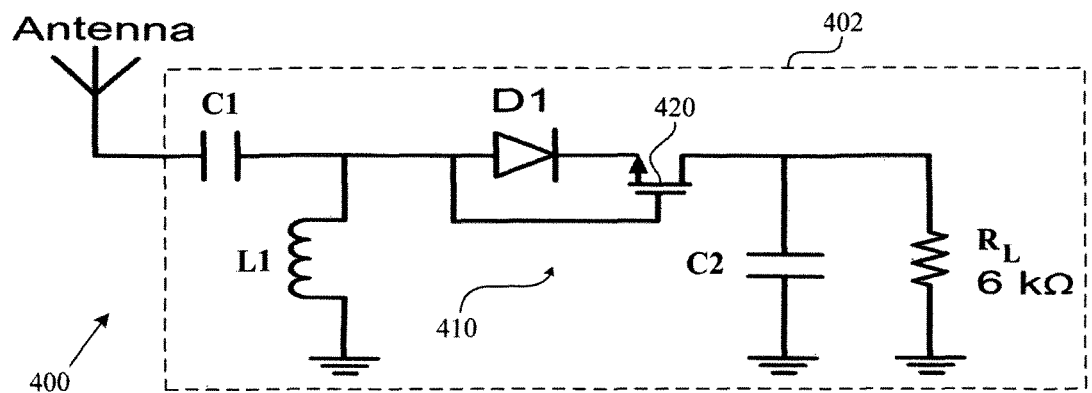
FIG. 10A is a schematic illustration of a breakdown-protected rectenna based upon a breakdown-protected rectifier in accordance with an embodiment of the present disclosure.

FIG. 10A is a schematic illustration of a breakdown-protected rectenna 400 based upon a breakdown-protected rectifier 402 in accordance with an embodiment of the present disclosure. In various embodiments, the breakdown-protected rectifier 402 includes a transistor-protected diode structure 410 that includes at least one diode coupled to a transistor in a manner that protects the diode from direct exposure to negative voltages that would ordinarily cause the diode to break down in the absence of the transistor. For an embodiment in which the transistor-protected diode structure 410 includes a single diode D1 and a single transistor, a first or control terminal of a transistor is coupled to the anode of diode D1; a second transistor terminal is coupled in series to the output or cathode of diode D1; and a third transistor terminal is coupled to a load resistance $R_L$. As a result of such transistor coupling, a negative voltage having a magnitude equal to or greater than the reverse breakdown voltage of diode D1, to which diode D1 would normally be directly exposed in the absence of the transistor, is instead expressed across the combination of the transistor and diode D1. The transistor thus protects diode D1 from direct exposure to a negative voltage having a magnitude that exceeds diode D1's breakdown voltage, until the transistor itself is exposed to a negative voltage between its control terminal and its third terminal that causes junction breakdown within transistor itself.

Figure 11A:
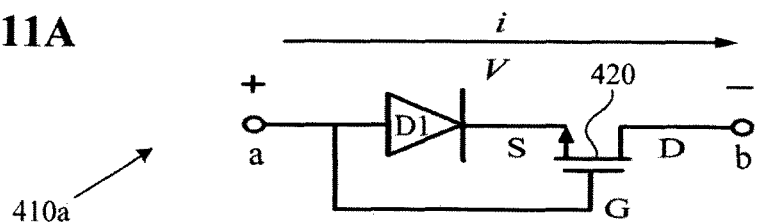
FIGS. 11A-11H are schematic illustrations of a first through a seventh transistor-protected diode structure, respectively, in accordance with an embodiment of the present disclosure.

FIG. 11A is a schematic illustration of a first transistor-protected diode structure 410a in accordance with an embodiment of the present disclosure. In several embodiments, the first transistor-protected diode structure 410a includes a MOSFET 420 having a gate coupled to the input or anode of diode D1; a source coupled to the output or cathode of diode D1; and a drain couplable to a load resistance $R_L$. In a representative implementation, diode D1 can be a Schottky diode, such as an Avago HSMS-2852, having a forward threshold voltage of approximately 150 mV and a reverse breakdown voltage of approximately −3.8 V; and the MOSFET 420 can be an n-channel depletion mode MOSFET, such as a BF998 MOSFET (NXP Semiconductors, Eindhoven, NL), which has a threshold voltage $V_{th}$ of approximately −0.8V. When the combination of diode D1 and the MOSFET 420 is forward biased ($V_a > V_b$), the MOSFET is in the ON state because $V_{gs}$ is positive, and the combination behaves like a single diode having approximately the same built-in voltage as diode D1 by itself. One having ordinary skill in the relevant art will understand that there will be a small amount of resistive loss in the MOSFET 420 under such operating conditions.

When the combination of diode D1 and the MOSFET 420 is reverse biased ($V_a < V_b$) and $V_{ab}$, is negative but larger than the breakdown voltage of diode D1, $V_{gs}$ is smaller than the MOSFET's threshold voltage. Therefore, MOSFET 420 transitions to an OFF state before diode D1 breaks down. Consequently, even if the overall bias voltage $V_{ab}$ across the combination of diode D1 and the MOSFET 420 is beyond the breakdown voltage of diode D1, the actual voltage across diode D1 remains smaller that its breakdown voltage because the major portion of the voltage is sustained between the drain and the source of the MOSFET 420. When the overall bias voltage $V_{ab}$ is beyond the maximum gate-to-drain voltage $V_{gd}$ that the MOSFET 420 can withstand, the MOSFET 420 will break down.

Figure 12:
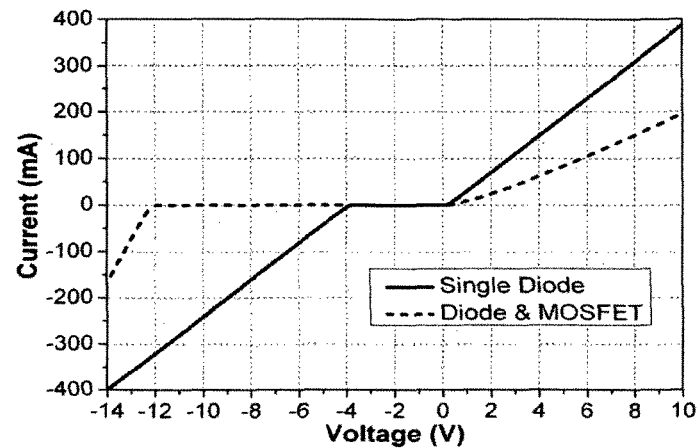
FIG. 12 is a graph illustrating I-V characteristics for an individual diode D1 and the first transistor-protected diode structure 410a of FIG. 11A.

FIG. 12 is a graph illustrating the I-V characteristics of each of diode D1 and the first transistor-protected diode structure 410a, in accordance with the aforementioned representative implementations thereof. As clearly indicated in FIG. 12, the first transistor-protected diode structure 410a exhibits a breakdown voltage having a magnitude that is dramatically greater than that of diode D1 alone. As a result, incorporation of a transistor-protected diode structure 420 into a rectifier can be expected to significantly or dramatically enhance the rectifier's RF-to-DC PCE.

Figure 2C:
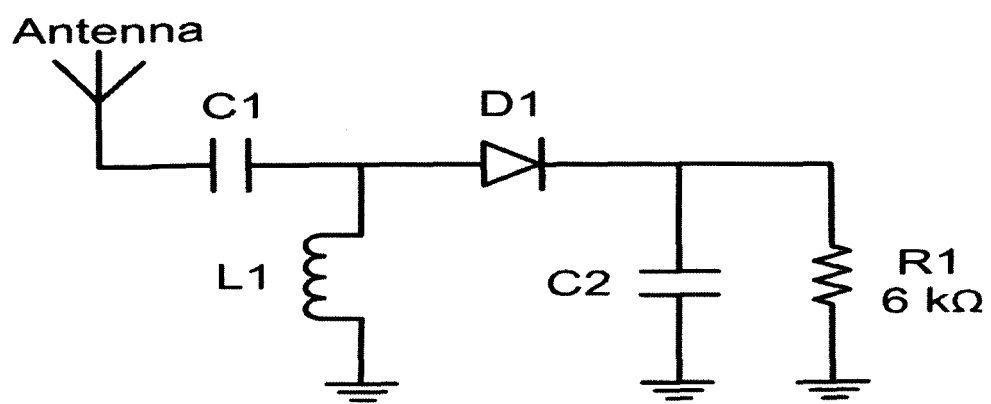
FIG. 2C is a schematic illustration of a conventional rectenna that utilizes another conventional low RF input power rectifier.
Figure 13:
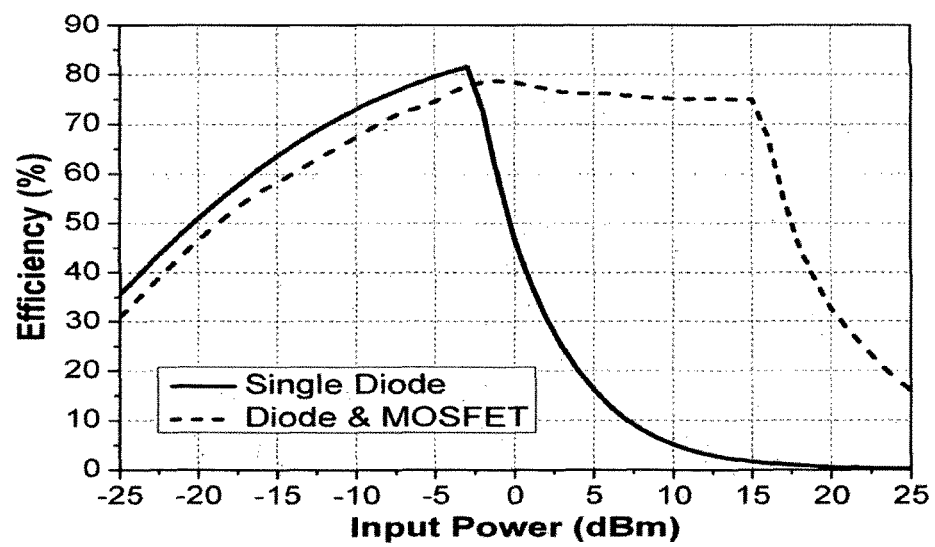
FIG. 13 is a graph illustrating simulated RF-to-DC PCE versus input RF power level for the rectifier shown in FIG. 2C as well as the breakdown-protected rectifier of FIG. 10A.

FIG. 13 is a graph illustrating simulated RF-to-DC PCE versus input RF power level for the rectifier shown in FIG. 2C as well as the breakdown-protected rectifier 402 of FIG. 10A at a representative operating frequency of 50 MHz. Each such circuit utilizes C1=8 pF, L1=750 nH, C2=10 pF, and $R_L$=6.0 kΩ. Diode D1 and the MOSFET 420 are defined in accordance with the representative implementations thereof indicated above. The conventional rectifier of FIG. 2C provides an RF-to-DC PCE above 50% for input RF power levels between approximately −20.5 to −0.5 dBm. For higher input RF power levels, the RF-to-DC PCE of the conventional rectifier of FIG. 2C degrades sharply because the voltage swings across diode D1 exceed its breakdown voltage. Thus, the conventional rectifier of FIG. 2C is suitable only for low RF input power conditions.

As shown in FIG. 13, the RF-to-DC PCE of the breakdown-protected rectifier 402 of FIG. 10A is slightly less than that of the conventional rectifier of FIG. 2C for input RF power between approximately −25 dBm to −2.5 dBm, which can be attributed to the small resistive loss associated with the MOSFET 420. However, the RF-to-DC PCE of the breakdown-protected rectifier 402 remains above 50% for input RF power levels from approximately −18.5 to 17.5 dBm, clearly indicating that the operating input RF power range of the breakdown-protected rectifier 402 is significantly extended compared to that of the conventional rectifier of FIG. 2A.

Figure 10B:
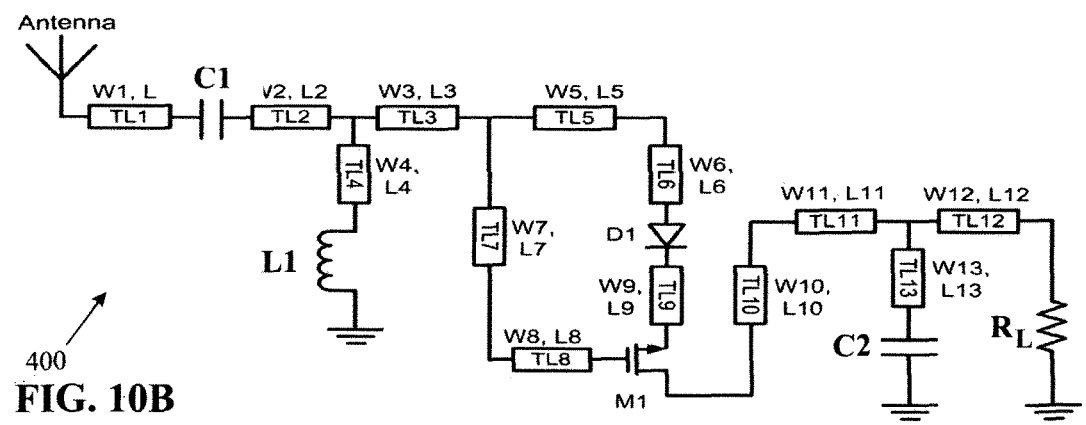
FIG. 10B is a schematic illustration of a representative implementation of the breakdown-protected rectifier of FIG. 10A.
Figure 10C:
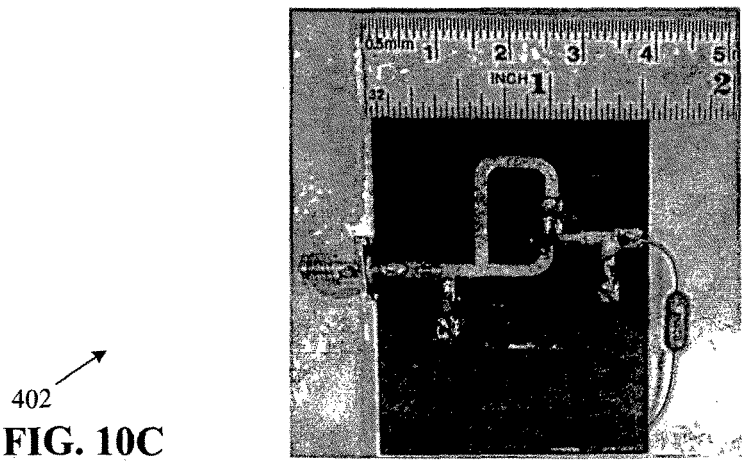
FIG. 10C is an image of the as-fabricated representative implementation of the breakdown-protected rectifier of FIG. 10B.

FIG. 10B is a schematic illustration of a representative implementation of the breakdown-protected rectifier 402 of FIG. 10A. In this representative implementations, the widths and lengths of transmission lines TL1 through TL13 in millimeters are as follows: W1=2.4; L1=5.0; W2=W3 W4=W5=W6=W7=1.8; L2=2.9; L3=4.8; L4=4.0; L5=− 9.25; L6=1.2; L7=25.6; W8=3; L8=2; W9=1; L9=1.8; W10=1.0; L10=4.2; W11=W13=1.8; W12=3; L11=3.9; L12=4.9; and L13=4.0. As above, C1=8 pF; L1=750 nH; C2=100 pF, and RL=6.0 kΩ. This representative implementation of the breakdown-protected rectifier 400 was fabricated on a 31 mil thick Rogers RT/duroid 5880 substrate, which has a dielectric constant of 2.2 and a loss tangent of 0.0012. FIG. 10C is an image of the as-fabricated representative implementation of the breakdown-protected rectifier 402.

Figure 14:
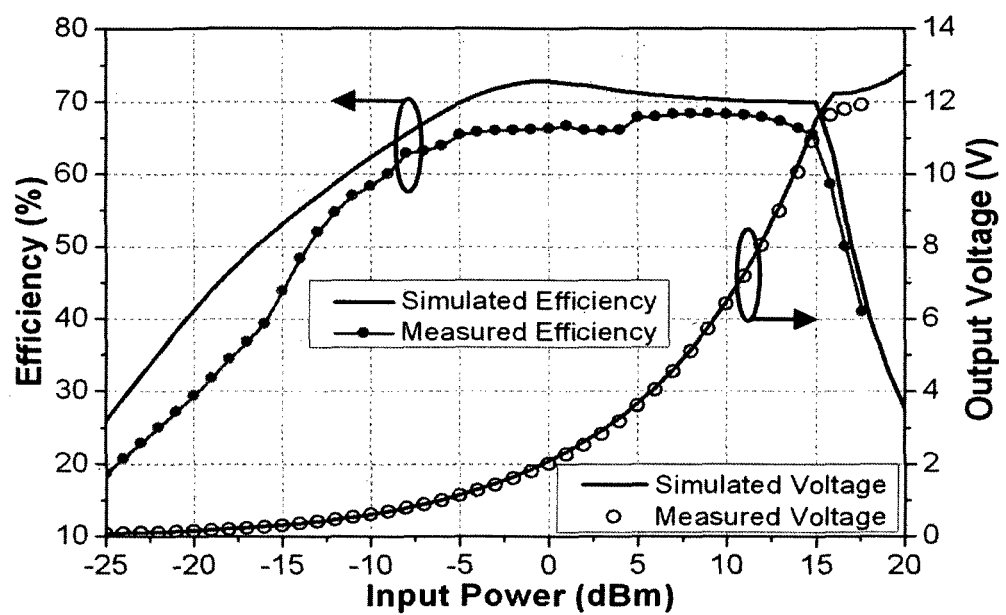
FIG. 14 is a graph showing measured versus simulated RF-to-DC PCE, as well as measured versus simulated output voltage, as a function of input RF power for the representative implementation of the breakdown-protected rectifier of FIGS. 10B and 10C.

FIG. 14 is a graph showing measured versus simulated RF-to-DC PCE, as well as measured versus simulated output voltage, as a function of input RF power for the aforementioned representative implementation of the breakdown-protected rectifier 402 of FIGS. 10B and 10C. Measured and simulated results exhibit good agreement with each other. The measured RF-to-DC PCE was greater than 50% across an input RF power range from approximately −13.5 dBm to 16.7 dBm. Additionally, the highest DC output voltage reached approximately 11.9V for input RF power of about 17.6 dBm. Thus, the breakdown-protected rectifier 402 can enhance RF-to-DC PCE in WPT and/or ambient RF energy harvesting applications in which a wide operating RF input power range is desired or required.

Figure 11B:
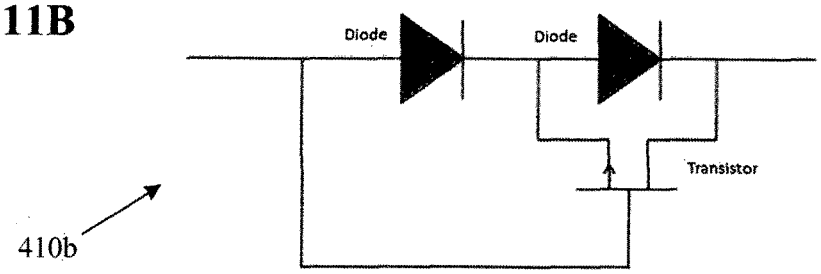

In addition to the first transistor-protected diode structure 410a, a variety of other transistor-protected diode structures 410 exist. For instance, FIGS. 11B-11H are schematic illustrations of a second through a seventh transistor-protected diode structure 410*b-h*, which can be incorporated into a rectifier to form a breakdown-protected rectifier 400 in accordance with an embodiment of the present disclosure. As indicated in FIG. 11B, a second diode D2 can be coupled such that it is coupled in parallel with the source and drain of the MOSFET 420. More particularly, the anode of diode D2 can be coupled to the cathode of diode D1, and hence to the source of the MOSFET 420; and the cathode of diode D2 is coupled to the drain of the MOSFET 420, and hence to a load resistor $R_L$. The presence of diode D2 can facilitate the reduction of minimization of forward resistive losses within the MOSFET 420 under forward biasing conditions, in a manner readily understood by one having ordinary skill in the relevant art.

Figure 11C:
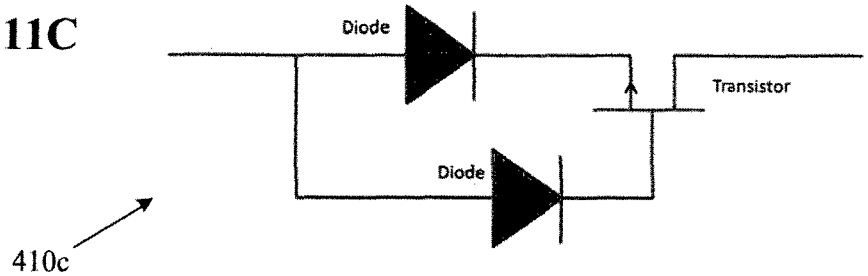
Figure 11D:
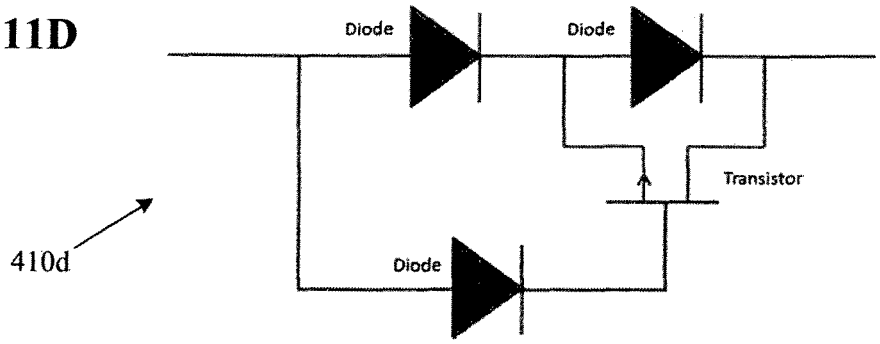
Figure 11E:
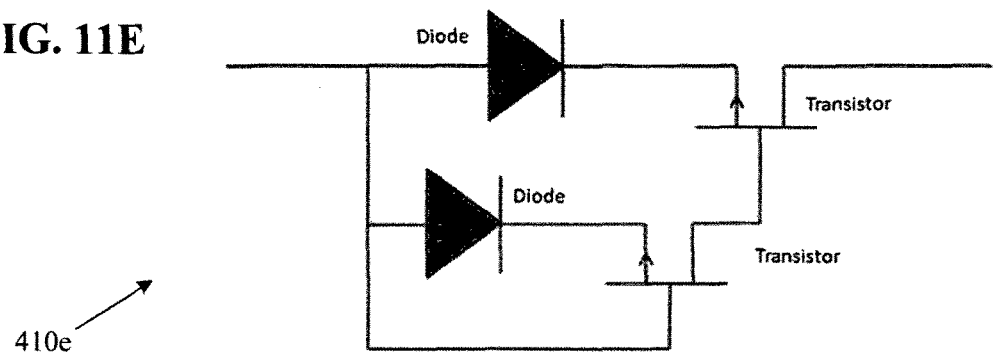
Figure 11F:
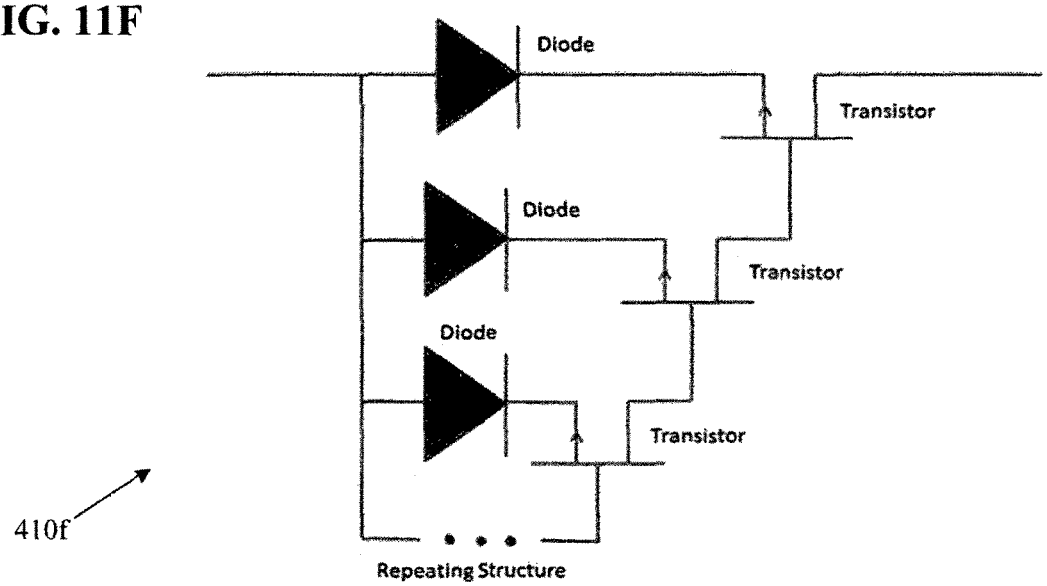
Figure 11G:
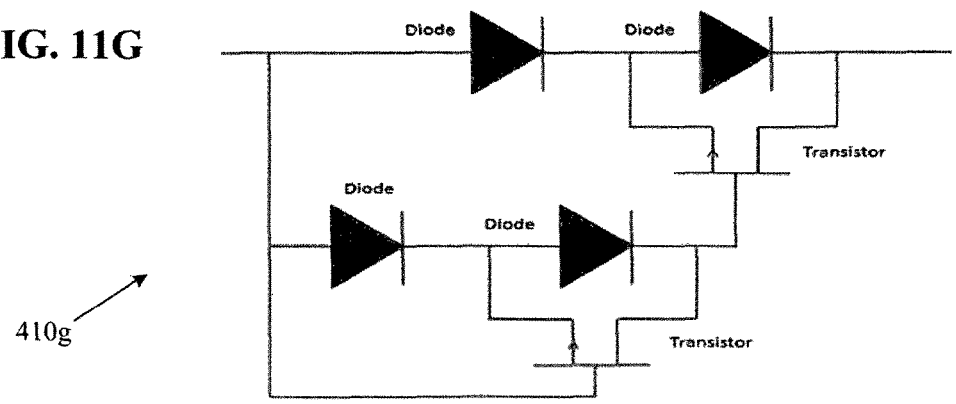
Figure 11H:
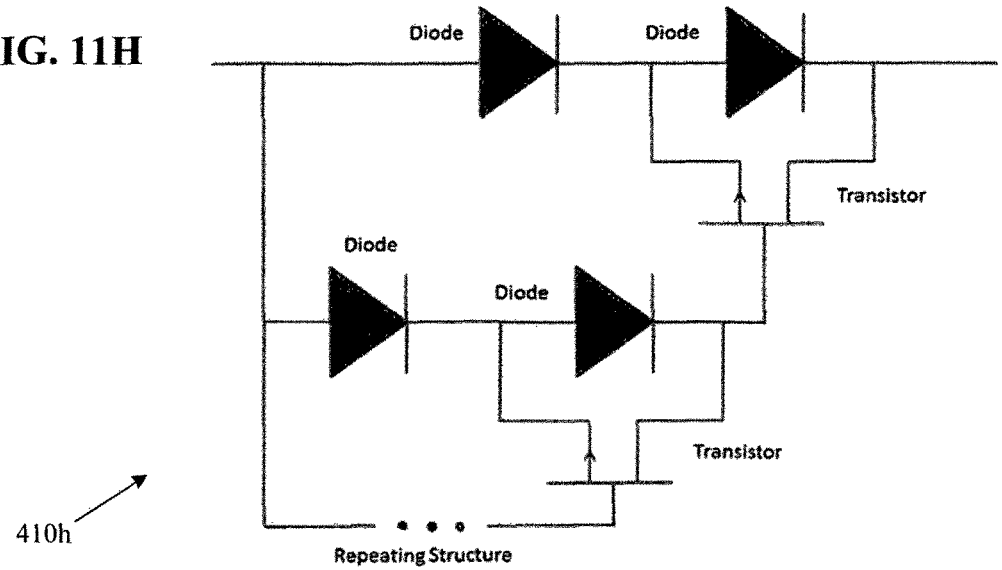

As indicated in FIGS. 11C and 11D, as well as FIGS. 11E-11H, circuit elements can be coupled to the gate of the MOSFET 420 to distribute reverse voltages across the gate-to-drain junction of the MOSFET 420 in addition to one or more types of circuit elements under consideration, thereby further increasing the overall magnitude of the breakdown voltage for the transistor-protected diode structure 410 under consideration relative to the breakdown voltage of the first transistor-protected diode structure 410*a* of FIG. 11A. FIGS. 11E-11H illustrate manners in which particular individual transistor-protected diode structures 410 can be cascaded or iteratively coupled to achieve breakdown voltage enhancement compared to the first transistor-protected diode structure 410*a*.

Further Representative Rectenna Designs

Figure 15A:
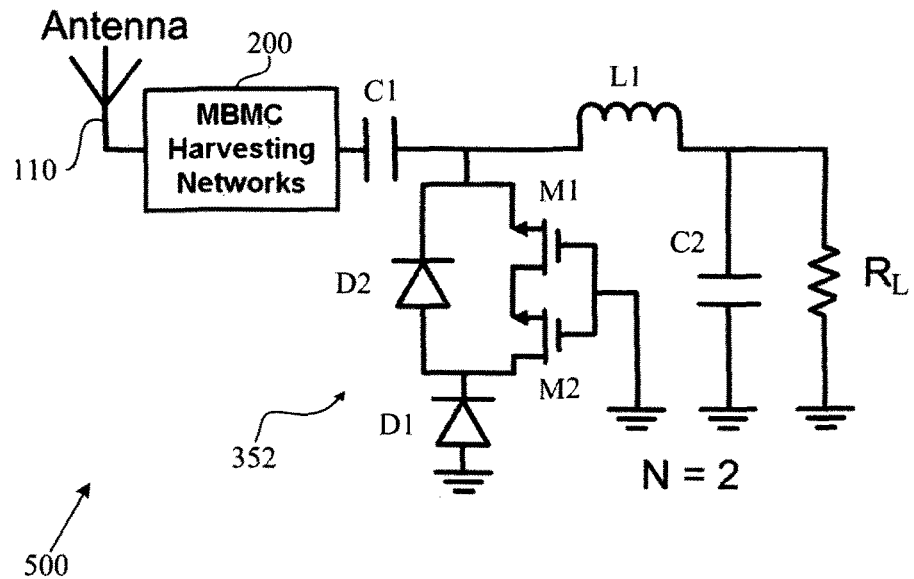
FIG. 15A illustrates a rectenna having each of an MBMC matching network and a second adaptively reconfigurable rectifier in accordance with an embodiment of the present disclosure.
Figure 15B:
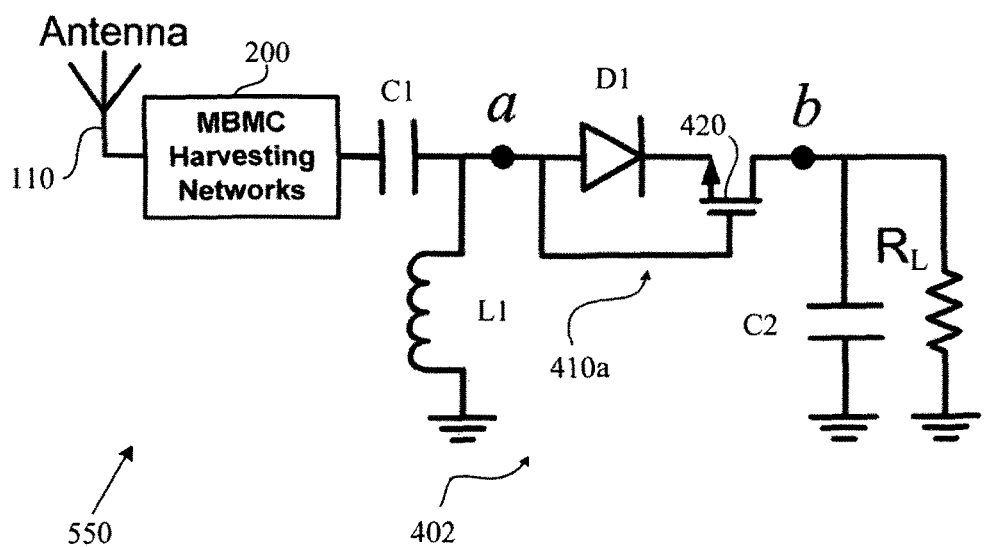
FIG. 15B illustrates a rectenna having each of an MBMC matching network and a breakdown-protected rectifier in accordance with an embodiment of the present disclosure.

Rectennas in accordance with embodiments of the present disclosure can include an MBMC matching network 200, either alone or in combination with either of an adaptively reconfigurable rectifier 300, 350 or a transistor-protected rectifier 400. For instance, FIG. 15A illustrates a rectenna 500 having each of an MBMC matching network 200 and a second adaptively reconfigurable rectifier 352 in accordance with an embodiment of the present disclosure. FIG. 15B illustrates a rectenna 550 having each of an MBMC matching network 200 and a breakdown-protected rectifier 402 in accordance with an embodiment of the present disclosure.

Further Performance Comparisons

Figure 16:
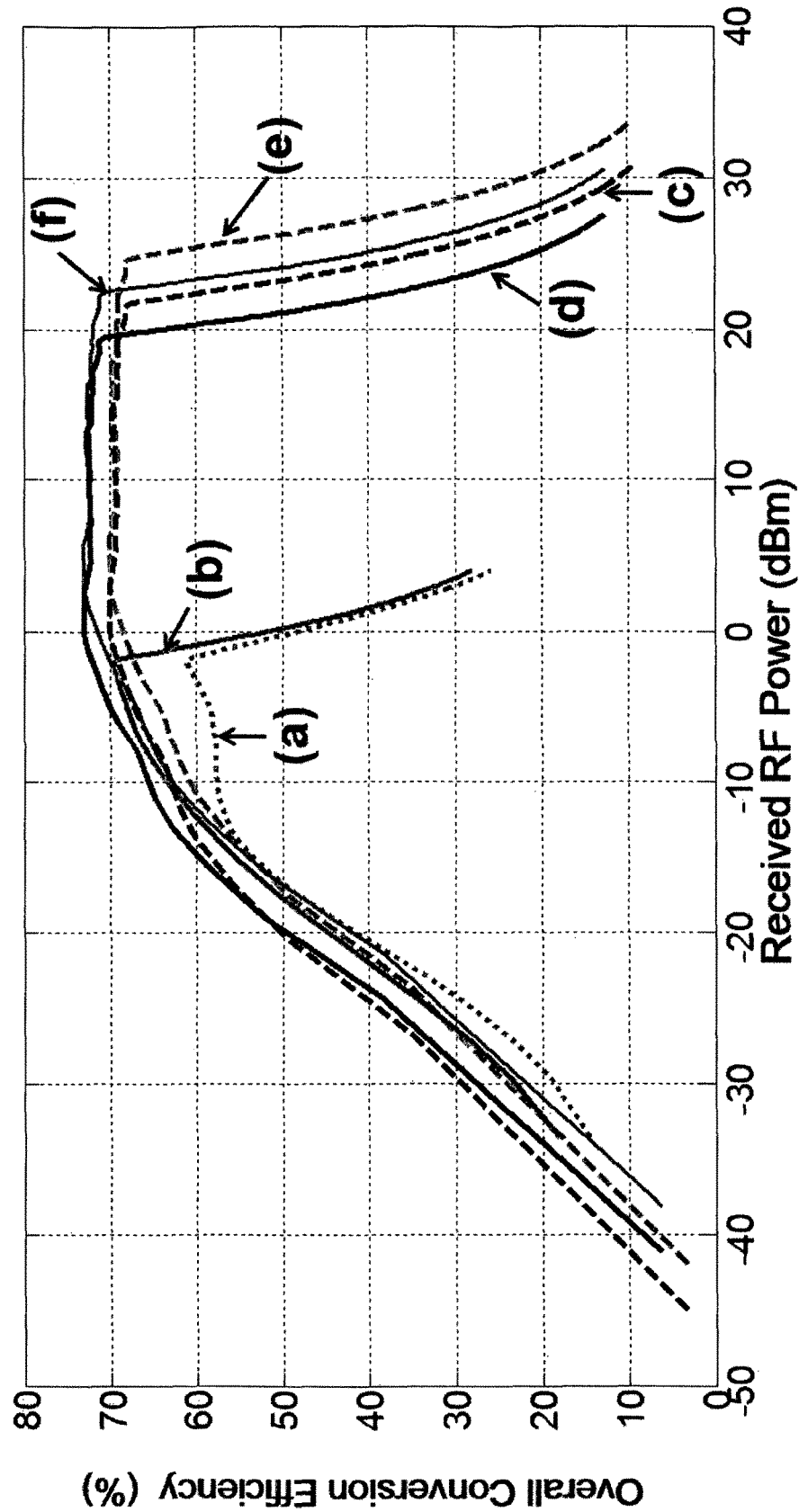
FIG. 16 is a graph illustrating simulated RF-to-DC PCE versus input RF power for representative implementations of each of (a) the conventional low input RF power rectifier of FIG. 2A; (b) the MBMC rectifier of FIG. 3; (c) the second adaptively reconfigurable rectifier shown in FIG. 8B; (d) the MBMC matching network coupled to the second adaptively reconfigurable rectifier 352, in a manner shown in FIG. 15A; (e) the breakdown-protected rectifier of FIG. 10A; and (f) the MBMC matching network coupled to the breakdown-protected rectifier 402, in a manner shown in FIG. 15B.

FIG. 16 is a graph illustrating simulated RF-to-DC PCE versus input RF power for representative implementations of each of (a) the conventional low input RF power rectifier of FIG. 2A; (b) the MBMC rectifier 102 of FIG. 3; (c) the second adaptively reconfigurable rectifier 352 shown in FIG. 8B; (d) the MBMC matching network 200 coupled to the second adaptively reconfigurable rectifier 352, in a manner shown in FIG. 15A; (e) the breakdown-protected rectifier 402 of FIG. 10A; and (f) the MBMC matching network 200 coupled to the breakdown-protected rectifier 402, in a manner shown in FIG. 15B.

As indicated in FIG. 16, each of the rectifiers corresponding to simulation results (b) through (f) exhibit enhanced RF-to-DC PCE compared to the conventional low input RF power rectifier shown in FIG. 2A. Furthermore, each of the second adaptively reconfigurable rectifier 352, the breakdown-protected rectifier 402, and the combination of the MBMC matching network 200 coupled with either of the second adaptively reconfigurable rectifier 352 or the breakdown-protected rectifier 402 exhibit a significantly or dramatically enhanced or extended input RF power operating range compared to the conventional low input RF power rectifier shown in FIG. 2A.

The main function of a MBMC network 200 within an MBMC rectifier 102 in accordance with an embodiment of the present disclosure is to collect more ambient RF power in order to increase the input RF power level so as to increase the overall RF-to-DC PCE of a WPT or an ambient RF energy harvesting system, apparatus, device, or circuit. On the other hand, an adaptively reconfigurable rectifier 302, 352 or a breakdown-protected rectifier 402 in accordance with an embodiment of the present disclosure is mainly used to enhance the breakdown voltage of a rectifier's semiconductor diode component(s), to thereby significantly enhance the input RF power operating range of the rectifier.

The combination of an MBMC matching network 200 in accordance with an embodiment of the present disclosure with an embodiment of either of an adaptively reconfigurable rectifier 302, 352 (e.g., as shown in FIG. 15A) or a breakdown-protected rectifier 402 (e.g., as shown in FIG. 15B) provides an enhanced or higher RF-to-DC PCE and much higher breakdown power performance when compared with a conventional low RF input power rectifier or a rectifier that includes the MBMC matching network 200, but which excludes adaptively reconfigurable circuit elements or transistor-protected diodes, respectively, in accordance with embodiments described herein.

An adaptively reconfigurable rectifier 302,352 or a breakdown protected rectifier 402 that is coupled to or which includes an MBMC matching network 200 can collect more RF power than a rectifier configured to receive RF power within a single RF frequency band, and can have a higher RF-to-DC PCE compared with an adaptively reconfigurable rectifier 302,352 or a breakdown protected rectifier 402 that is not coupled to or which excludes an MBMC matching network 200. However, an adaptively reconfigurable rectifier 302, 352 or a breakdown-protected rectifier 402 that is coupled to or which an MBMC matching network 200 will reach its breakdown power level at a lower overall input RF power level than an adaptively reconfigurable rectifier 302, 352 or a breakdown-protected rectifier 402 that is not coupled to or which excludes an MBMC matching network 200, due to greater RF energy collection or harvesting by the MBMC matching network 200 under the same RF environmental conditions.

Wireless Network Considerations

A rectenna or rectifier in accordance with an embodiment of the present disclosure (e.g., essentially any rectenna that includes an MBMC matching network 200 and/or one of an adaptively reconfigurable rectifier 350, 352 or a breakdown-protected rectifier 400) can be utilized in or form a portion of a wireless network configured for transmitting/receiving (TX/RX) electromagnetic signals. The use of a particular rectenna or rectifier structure or topology in accordance with an embodiment of the present disclosure within a given wireless network, and the implementation thereof, can be based upon a wireless network architecture or application, input RF power operating range, a set of RF frequency bands under, and/or particular RF-to-DC PCE objectives/requirements under consideration.

Figure 17A:
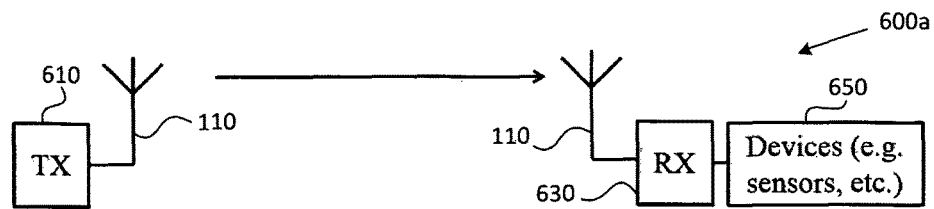
FIGS. 17A-17H are block diagrams illustrating representative types of wireless networks in which a set of rectennas, including one or more MBMC rectennas, adaptively reconfigurable rectennas, and/or breakdown-protected rectennas, in accordance with an embodiment of the present disclosure can be deployed.

FIGS. 17A-17H are block diagrams illustrating representative types of wireless networks 600 in which a set of rectennas (e.g., including one or more MBMC rectennas 100, adaptively reconfigurable rectennas 300, 350, and/or breakdown-protected rectennas 400) in accordance with one or more embodiments of the present disclosure can be deployed. More particularly, FIG. 17A illustrates a one-to-one TX/RX wireless network 600*a* in which a single TX stage 610 wirelessly transfers signals to a single RX stage 630. The RX stage 630 is coupled to a set of devices 650 such as a set of sensors. In a WPT application, the set of devices 650 can receive power output by the RX stage 630, which converts RF signals received from the TX stage 610 into DC signals in a manner identical, essentially identical, or analogous to that described herein (e.g., by way of an MBMC rectenna 100, an adaptively reconfigurable rectenna 300, 350, or a breakdown-protected rectenna 400), in a manner readily understood by one having ordinary skill in the relevant art.

Figure 17B:
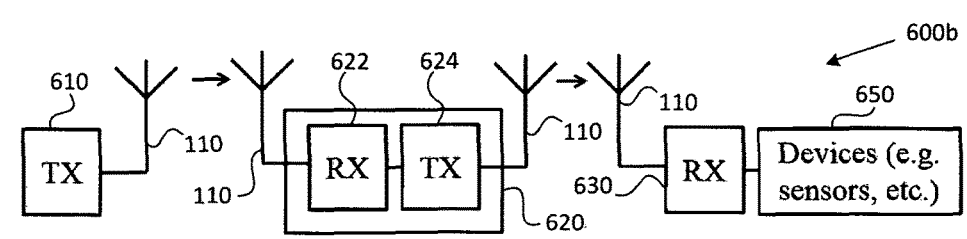

FIG. 17B illustrates a TX/RX wireless network 600*b* including one "repeater"/"amplification" stage 620 disposed between a TX stage 610 and an RX stage 630, where; the RX stage 630 is coupled to a set of devices 650 (e.g., a set of sensors) as above. The TX stage 610 can wirelessly transfer RF signals to the repeater/amplification stage 620, which can further wirelessly transfer RF signals to the RX stage 630. The repeater/amplification stage 620 includes an adjunct RX stage 622 configured for receiving RF signals from the TX stage 610; and an adjunct TX stage 624 configured for transmitting RF signals to the RX stage 630. The presence of the repeater/amplification stage 620 can extend the physical range across which the TX stage 610 and the RX stage 630 are separable/separated, and/or enhance the likelihood of reliable wireless signal reception by the RX stage 630. One or both of the repeater/amplification stage 620 and the RX stage 630 can receive power by way of WPT and/or ambient RF energy harvesting (e.g., by way of an MBMC rectenna 100, an adaptively reconfigurable rectenna 300, 350, a breakdown-protected rectenna 400, or a combination of an MBMC rectenna 100 with one of an adaptively reconfigurable rectenna 300, 350 or a breakdown-protected rectenna 400), depending upon embodiment details. Furthermore, depending upon embodiment details, the RX stage 630 and the adjunct RX stage 622 can have identical, similar, or different structures or topologies.

Figure 17C:
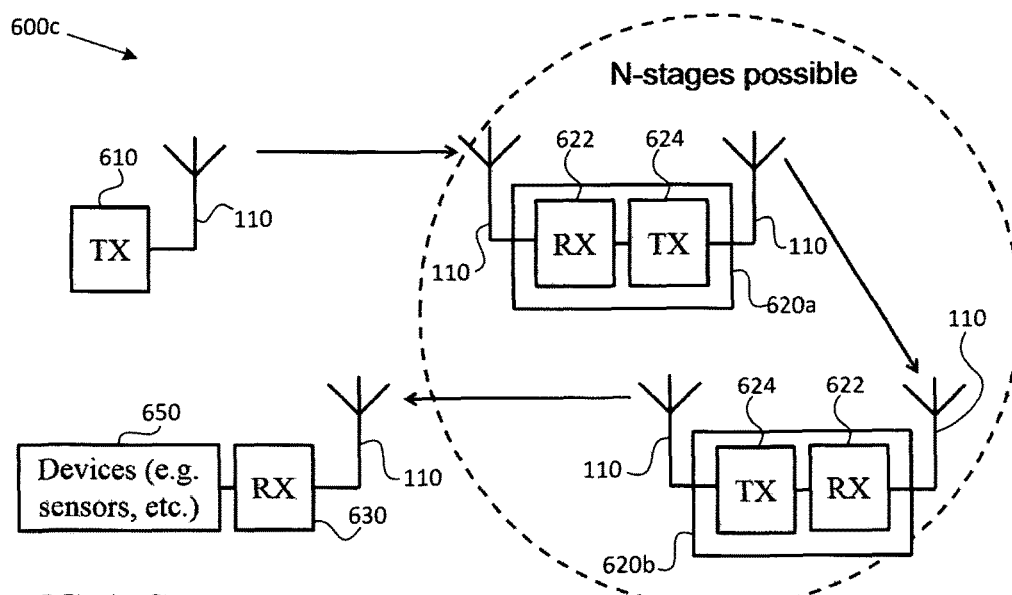
Figure 17D:
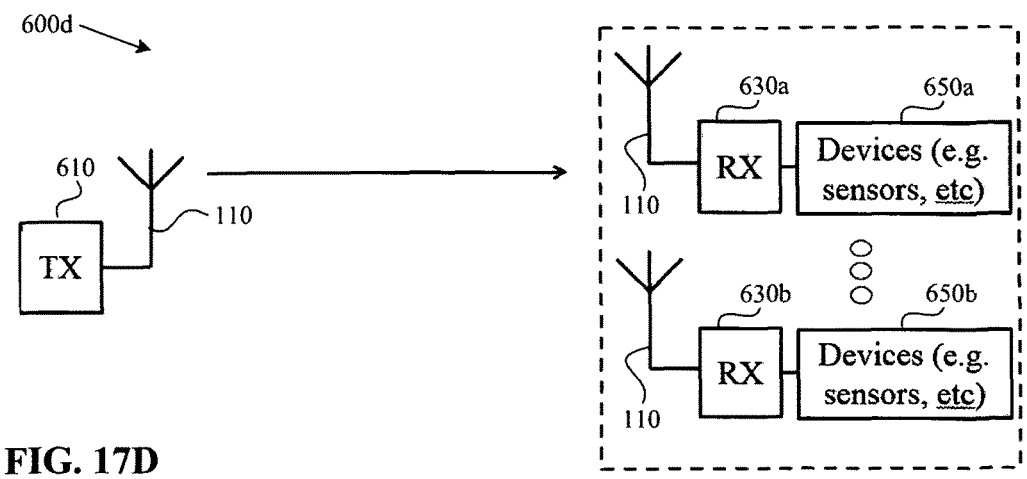
Figure 17E:
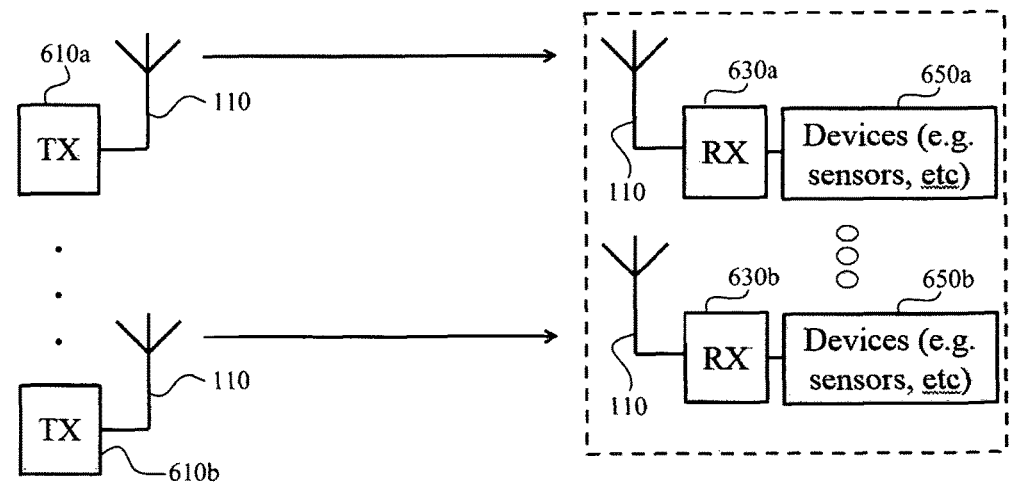
Figure 17F:
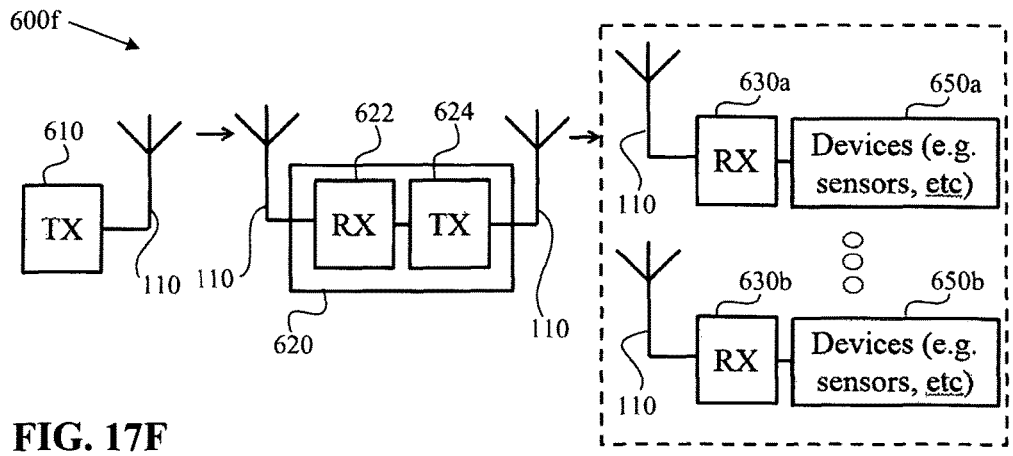
Figure 17G:
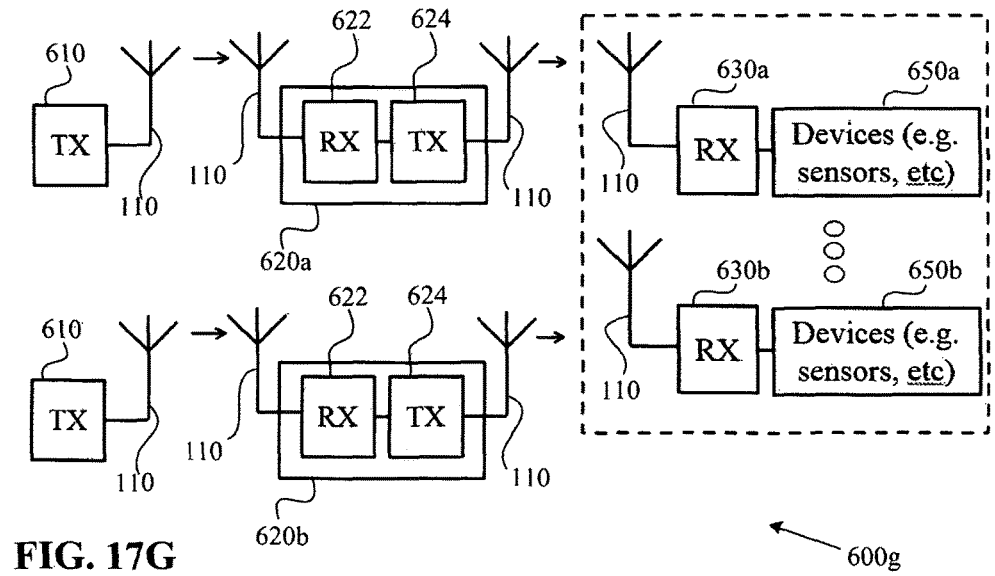
Figure 17H:
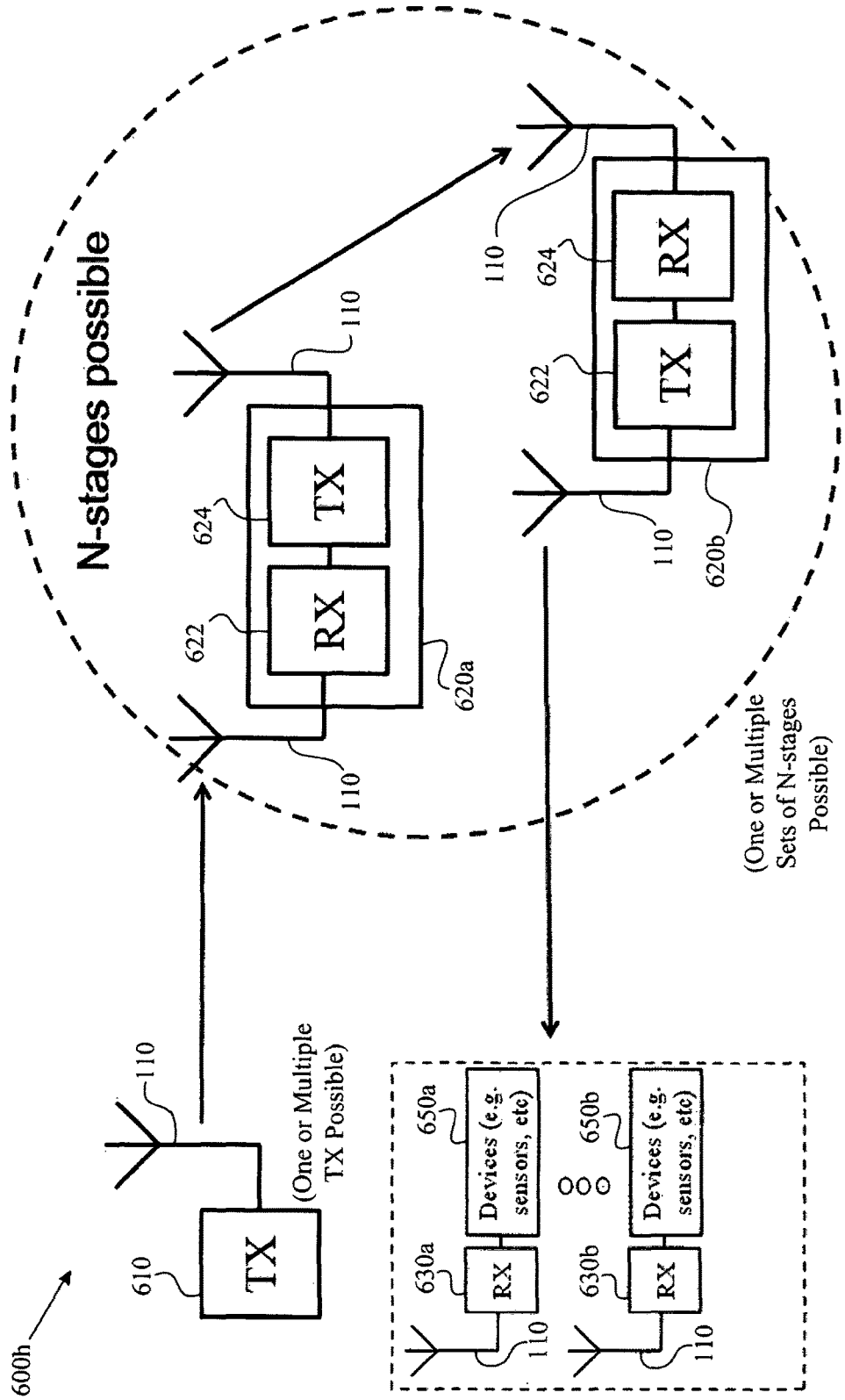

In a manner analogous to that shown in FIG. 17B, FIG. 17C illustrates a TX/RX wireless network 600*c* including multiple repeater/amplification 620*a,b* stages disposed between a TX stage 610 and an RX stage 630. Each repeater/amplification stage 620 includes an adjunct RX stage 622 and an adjunct TX stage 624, in a manner analogous to that described above. The RX stage 630 and/or one or more of the repeater/amplification stages 620*a,b* can receive power by way of WPT and/or ambient RF energy harvesting (e.g., by way of an MBMC rectenna 100, an adaptively reconfigurable rectenna 300, 350, a breakdown-protected rectenna 400, or a combination of an MBMC rectenna 100 with one of an adaptively reconfigurable rectenna 300, 350 or a breakdown-protected rectenna 400), depending upon embodiment details. Here again, the presence of each repeater/amplification stage 620*a,b* can extend the physical range across which the TX stage 610 and the RX stage 630 are separable/separated, and/or enhance the likelihood of reliable wireless signal reception by the RX stage 630. Such a wireless network 600*c* can be scaled to include N repeater/amplification stages 620, in a manner understood by one having ordinary skill in the relevant art. Depending upon embodiment details, the RX stage 630 and one or more adjunct RX stages 622 can have identical, similar, or different structures or topologies.

FIGS. 17D-17H illustrate further wireless network architectures or configurations 600*d-h* in which one or more RX stages 630 and/or one or more repeater/amplification stages 620 can employ an MBMC rectenna 100, an adaptively reconfigurable rectenna 300, 350, or a breakdown-protected rectenna 400, in a manner analogous to that described above. In general, one or more rectenna embodiments in accordance with the present disclosure can be utilized in or form portions of an m-to-p TX/RX network, where m indicates the number of TX stages 610 and p indicates the number of RX stages 630 present in the network. Each of m and p can be one or more (e.g., m can equal 1, indicating a single TX stage 610; and p can equal 1, several, dozens, hundreds, thousands, or more, indicating the presence of one to possibly hundreds, thousands, or more RX stages 630). Similarly, one or more rectenna embodiments in accordance with the present disclosure can be utilized in or form portions of an m-to-n-to-p TX/repeater-amplification/RX network, where m indicates the number of TX stages 610; n indicates the number of repeater/amplification stages 620; and p indicates the number of RX stages 630 in the network. Each of m, n, and p can be one or more, in a manner identical, essentially identical, or analogous to that previously indicated.

Thus, in view of the foregoing, one or more rectennas in accordance with various embodiments of the present disclosure can be utilized in or form portions of essentially any type of wireless network organized in accordance with essentially any type of wireless network topology, wherein electromagnetic signals are received and rectified. Furthermore, one or more RX stages 630 and/or one or more repeater/amplification stages 620 within such wireless networks can receive power by way of WPT and/or ambient RF energy harvesting, such as by way of an MBMC rectenna 100, an adaptively reconfigurable rectenna 300, 350, or a breakdown-protected rectenna 400 in a manner identical, analogous, or generally analogous to that described above, depending upon embodiment details.

Aspects of particular embodiments of the present disclosure address at least one aspect, problem, limitation, and/or disadvantage associated with existing rectenna and/or rectifier circuit elements, circuits, or techniques. While features, aspects, and/or advantages associated with certain embodiments have been described in the disclosure, other Embodiments may also exhibit such features, aspects, and/or advantages, and not all embodiments need necessarily exhibit such features, aspects, and/or advantages to fall within the scope of the disclosure. It will be appreciated by a person of ordinary skill in the art that several of the above-disclosed systems, components, processes, or alternatives thereof, may be desirably combined into other different systems, components, processes, and/or applications. In addition, various modifications, alterations, and/or improvements may be made to various embodiments that are disclosed by a person of ordinary skill in the art within the scope and spirit of the present disclosure.

The invention claimed is:

1. A circuit configured for receiving RF energy distributed in multiple RF frequency bands, the circuit including a multi-band multi-channel (MBMC) matching network, the MBMC matching network comprising:

a plurality of T-shaped transmission line matching structures, each T-shaped transmission line matching structure coupled in series to another T-shaped transmission line matching structure, wherein each T-shaped transmission line matching structure within the plurality of T-shaped transmission line structures includes a first portion, a second portion, and a third portion coupled between the first portion and the second portion, the first portion, second portion and third portion of each T-shaped transmission line matching structure having a respective width and length, wherein the first portion of a first T-shaped transmission line matching structure within the plurality of T-shaped transmission line structures forms an input of the MBMC matching network, the second portion of a second T-shaped transmission line matching structure within the plurality of T-shaped transmission line matching structures forms an output of the MBMC matching network, and the third portion of at least one T-shaped transmission line matching structure within the plurality of T-shaped transmission line matching structures is couplable to electrical ground, and wherein the width and length of the first portion, second portion and third portion of each of the plurality of T-shaped transmission line matching structures within the plurality of T-shaped transmission line structures is tuned to provide an impedance match corresponding to RF frequencies within a particular RF frequency band.

2. The circuit of claim 1, wherein the circuit includes a rectenna comprising:
an antenna coupled to the input of the MBMC Matching network; and
a rectifier coupled to the output of the MBMC matching network.

3. The circuit of claim 2, wherein the circuit forms a portion of a wireless power transmission (WPT) system or a portion of an ambient RF energy harvesting system.

4. A circuit configured for receiving RF energy distributed in multiple RF frequency bands, comprising:
a multi-band multi-channel (MBMC) matching network that includes: and
  a plurality of T-shaped transmission line matching structures, each T-shaped transmission line matching structure coupled in series to another T-shaped transmission line matching structure,
  wherein each T-shaped transmission line matching structure includes a first portion, a second portion, and a third portion coupled between the first portion and the second portion,
    wherein the first portion of a first T-shaped transmission line matching structure within the plurality of T-shaped transmission line structures forms an input of the MBMC matching network, the second portion of a second T-shaped transmission line matching structure within the plurality of T-shaped transmission line matching structures forms an output of the MBMC matching network, and the third portion of at least one T-shaped transmission line matching structure within the plurality of T-shaped transmission line matching structures is couplable to electrical ground; and
a rectenna that includes:
  an antenna coupled to the input of the MBMC Matching network, and
  a rectifier coupled to the output of the MBMC matching network, wherein the rectifier comprises one of an adaptively reconfigurable rectifier having a low input RF power rectifying portion, a high input RF power rectifying portion, and a set of transistors coupled to one of the high input RF power rectifying portion the low input RF power rectifying portion, the set of transistors configured for automatically transitioning the adaptively reconfigurable rectifier between a low input RF input power operating configuration and a high input RF power operating configuration based upon input RF power level, and a breakdown-protected rectifier having at least one transistor-protected diode structure, the transistor-protected diode structure comprising at least one diode coupled to a transistor in a manner that protects the diode from direct exposure to negative voltages that would ordinarily cause the diode to break down in the absence of the transistor.

5. A circuit configured for rectifying signals, comprising one of:
an adaptively reconfigurable rectifier having a low input power rectifying portion, a high input power rectifying portion, and a set of transistors coupled to one of the high input power rectifying portion the low input power rectifying portion, the set of transistors configured for selectively and automatically transitioning the adaptively reconfigurable rectifier between a low input power operating configuration and a high input RF power operating configuration in a manner correlated with a power level of a signal input to the circuit; and
a breakdown-protected rectifier having at least one transistor-protected diode structure, the at least one transistor-protected diode structure comprising a first diode coupled to a transistor in a manner that protects the first diode from direct exposure to negative voltages that would ordinarily cause the diode to break down in the absence of the transistor.

6. The circuit of claim 5, wherein the low input power portion and the high input power portion of the adaptively reconfigurable rectifier are coupled in series.

7. The circuit of claim 6, wherein the set of transistors of the adaptively reconfigurable is coupled in parallel with the high input power portion.

8. The circuit of claim 5, wherein a control terminal of each transistor within the set of transistors of the adaptively reconfigurable rectifier is coupled to electrical ground.

9. The circuit of claim 5, wherein the set of transistors of the adaptively reconfigurable rectifier includes a plurality of transistors coupled to each other in series.

10. The circuit of claim 5, wherein each transistor within the set of transistors is a Field Effect Transistor (FET).

11. The circuit of claim 5, wherein the low input power rectifying portion of the adaptively reconfigurable rectifier comprises a first set of diodes, and the high input power rectifying portion comprises a second set of diodes.

12. The circuit of claim 11, wherein at least one of the first set of diodes and the second set of diodes includes a plurality of diodes.

13. The circuit of claim 5, wherein the breakdown-protected rectifier comprises a first transistor-protected diode structure including a first diode and a transistor, and wherein the transistor includes a control terminal coupled to the anode of the first diode, a first terminal coupled to the cathode of the, first diode, and a second terminal couplable to circuitry external to the transistor-protected diode structure.

14. The circuit of claim 13, wherein the anode of the first diode is coupled to an input of the breakdown-protected rectifier and is configured to receive an alternating current (AC) signal, and wherein the second terminal of the transistor is coupled to an output of the breakdown-protected rectifier.

15. The circuit of claim 13, wherein the transistor-protected diode structure further includes a second diode coupled in parallel with the second terminal and the third terminal of the transistor, such that the anode of the second diode is coupled to the cathode of the first diode.

16. The circuit of claim 13, wherein the transistor-protected diode structure further includes a second diode having its anode coupled to the anode of the first diode, and its cathode coupled to the control terminal of the transistor.

17. The circuit of claim 13, wherein the breakdown-protected rectifier comprises the first transistor-protected diode structure combined with a second transistor-protected diode structure coupled in a cascaded manner to the first transistor-protected diode structure, such that a negative voltage across the combination of the first and second transistor-protected diode structures is distributed across the transistor of the first transistor-protected diode structure and a transistor of the second transistor-protected diode structure.

18. The circuit of claim 17, wherein the second transistor-protected diode structure comprises a first diode and a transistor having a control input, a first terminal, and a second terminal, and wherein the anode of the first diode of the second transistor- protected diode structure is coupled to the anode of the first diode of the first transistor-protected diode structure, the cathode of the first diode of the second transistor-protected diode structure is coupled to the second terminal of the transistor of the second diode-protected transistor structure, and the third terminal of the transistor of the second diode-protected transistor structure is coupled to the control input of the transistor of the first diode-protected transistor structure.

19. A wireless network comprising:
a transmission (TX) stage configured for wirelessly transmitting electromagnetic signals; and
a reception (RX) stage configured for receiving electromagnetic signals transmitted by the TX stage, the RX stage comprising one of:
(a) a multi-band multi-channel (MBMC) matching network comprising: a plurality of T-shaped, transmission line matching structures, each T-shaped transmission line matching structure coupled in series to another T-shaped transmission line matching structure,
wherein each T-shaped transmission line matching structure includes a first portion, a second portion, and a third portion coupled between the first portion and the second portion,
wherein the first portion of a first T-shaped transmission line matching structure within the plurality of T-shaped transmission line structures forms an input of the MBMC matching network, the second portion of a second T-shaped transmission line matching structure within the plurality of T-shaped transmission line matching structures forms an output of the MBMC matching network, and the third portion of at least one T-shaped transmission line matching structure within the plurality of T-shaped transmission line matching structures is couplable to electrical ground;
(b) an adaptively reconfigurable rectifier having a low input power rectifying portion, a high input power rectifying portion, and a set of transistors coupled to one of the high input power rectifying portion or the low input power rectifying portion, the set of transistors configured for selectively and automatically transitioning the adaptively reconfigurable rectifier between a low input power operating configuration and a high input RF power operating configuration in a manner correlated with a power level of a signal input to the RX stage; and (c) a breakdown-protected rectifier having at least one transistor-protected diode structure, the at least one transistor-protected diode structure comprising a first diode coupled to a transistor in a manner that protects the first diode from direct exposure to negative voltages that would ordinarily cause the diode to break down in the absence of the transistor.

20. The wireless network of claim 19, wherein the RX stage includes the MBMC matching network and one of the adaptively reconfigurable rectifier and the breakdown-protected rectifier.

21. The wireless network of claim 19, further comprising at least one repeater/amplification stage configured to receive electromagnetic signals from the TX stage and transmit electromagnetic signals to the RX stage, the at least one repeater/amplification stage comprising one of:
(a) a multi-band multi-channel (MBMC) matching network comprising:
a plurality of T-shaped transmission line matching structures, each T-shaped transmission line matching structure coupled in series to another T-shaped transmission line matching structure,
wherein each T-shaped transmission line matching structure includes a first portion, a second portion, and a third portion coupled between the first portion and the second portion,
wherein the first portion of a first T-shaped transmission line matching structure within the plurality of T-shaped transmission line structures forms an input of the MBMC matching network, the second portion of a second T-shaped transmission line matching structure within the plurality of T-shaped transmission line matching structures forms an output of the MBMC matching network, and the third portion of at least one T-shaped transmission line matching structure within the plurality of T-shaped transmission line matching structures is couplable to electrical ground;
(b) an adaptively reconfigurable rectifier having a low input power rectifying portion, a high input power rectifying portion, and a set of transistors coupled to one of the high input power rectifying portion the low input power rectifying portion, the set of transistors configured for selectively and automatically transitioning the adaptively reconfigurable rectifier between a low input power operating configuration and a high input RF power operating configuration in a manner correlated with a power level of a signal input to the RX stage; and
(c) a breakdown-protected rectifier having at least one transistor-protected diode structure, the at least one transistor-protected diode structure comprising a first diode coupled to a transistor in a manner that protects the first diode from direct exposure to negative voltages that would ordinarily cause the diode to break down in the absence of the transistor.

22. The wireless network of claim 21, wherein the at least one repeater/amplification stage includes an MBMC matching network and one of an adaptively reconfigurable rectifier and a breakdown-protected rectifier.

* * * * *